(12) United States Patent
Ohuchi et al.

(10) Patent No.: US 8,664,669 B2
(45) Date of Patent: *Mar. 4, 2014

(54) ORGANIC EL ELEMENT, DISPLAY APPARATUS, AND LIGHT-EMITTING APPARATUS

(75) Inventors: Satoru Ohuchi, Osaka (JP); Hirofumi Fujita, Osaka (JP); Shinya Fujimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/360,984

(22) Filed: Jan. 30, 2012

(65) Prior Publication Data

US 2012/0132934 A1    May 31, 2012

Related U.S. Application Data

(63) Continuation of application No. PCT/JP2010/004212, filed on Jun. 24, 2010.

(51) Int. Cl.
  *H01L 27/32* (2006.01)
(52) U.S. Cl.
  USPC .......... 257/88; 257/40; 257/79; 257/E51.027; 257/E51.018; 257/E27.119; 204/192.16; 313/504; 313/506; 313/498; 544/225; 427/66; 445/1; 564/427

(58) Field of Classification Search
  USPC .............................. 257/40; 313/498; 544/225
  See application file for complete search history.

(56) References Cited

U.S. PATENT DOCUMENTS

| | | | |
|---|---|---|---|
| 5,294,869 A | 3/1994 | Tang et al. | |
| 5,443,922 A | 8/1995 | Nishizaki et al. | |
| 5,688,551 A | 11/1997 | Littman et al. | |
| 6,132,280 A | 10/2000 | Tanabe et al. | |
| 6,284,393 B1 | 9/2001 | Hosokawa et al. | |
| 6,309,801 B1 | 10/2001 | Meijer et al. | |

(Continued)

FOREIGN PATENT DOCUMENTS

| | | |
|---|---|---|
| EP | 2175504 | 4/2010 |
| JP | 5-163488 | 6/1993 |

(Continued)

OTHER PUBLICATIONS

International Search Report in PCT/JP2010/004212, dated Aug. 3, 2010.

(Continued)

*Primary Examiner* — Jerome Jackson, Jr.
*Assistant Examiner* — Bo Fan
(74) *Attorney, Agent, or Firm* — Greenblum & Bernstein, P.L.C.

(57) ABSTRACT

An organic EL element has an anode, a cathode, a hole injection layer and at least one functional layer disposed between the anode and the cathode. The at least one functional layer contains an organic material. Holes are injected into the functional layer from the hole injection layer, which contains a tungsten oxide. A Ultraviolet Photoelectron Spectroscopy (UPS) spectrum obtained from a UPS measurement has a protrusion near a Fermi surface and within a region corresponding to a binding energy range lower than a top of the valence band. The tungsten oxide contained in the hole injection layer satisfies a condition, determined from an X-ray Photoelectronic Spectroscopy measurement, that a ratio in a number density of atoms other than tungsten and oxygen atoms to the tungsten atoms does not exceed approximately 0.83.

14 Claims, 13 Drawing Sheets

(56) References Cited

U.S. PATENT DOCUMENTS

| | | |
|---|---|---|
| 7,785,718 B2 | 8/2010 | Yatsunami et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1* | 2/2007 | Liu .................................. 257/40 |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0150422 A1 | 6/2008 | Ohara |
| 2008/0231179 A1 | 9/2008 | Abe et al. |
| 2008/0312437 A1* | 12/2008 | Inoue et al. .................... 544/225 |
| 2009/0160325 A1 | 6/2009 | Yatsunami et al. |
| 2009/0200917 A1* | 8/2009 | Yamagata et al. ............. 313/498 |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0213827 A1 | 8/2010 | Yoshida et al. |
| 2010/0258833 A1 | 10/2010 | Okumoto et al. |
| 2010/0302221 A1 | 12/2010 | Okumoto |
| 2011/0042703 A1 | 2/2011 | Okumoto et al. |
| 2011/0140091 A1* | 6/2011 | Friend et al. .................... 257/40 |
| 2012/0061656 A1 | 3/2012 | Ohuchi et al. |
| 2012/0178191 A1 | 7/2012 | Sakanoue et al. |

FOREIGN PATENT DOCUMENTS

| | | |
|---|---|---|
| JP | 10-162959 A | 6/1998 |
| JP | 2000-133446 | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2008/120714 A1 | 10/2008 |
| WO | 2008/149498 A1 | 12/2008 |
| WO | 2008/149499 A1 | 12/2008 |
| WO | 2010/032443 A1 | 3/2010 |
| WO | 2010/032444 A1 | 3/2010 |
| WO | 2010/058716 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

U.S. Appl. No. 13/361,280 to Takashi Isobe et al., filed Jan. 30, 2012.

Jingze Li et al., "Enhanced performance of organic light emitting device by insertion of conducting/insulating $WO_3$ anodic buffer layer", Synthetic Metals I51, 2005, pp. 141-146.

Kaname Kanai et al., "Electronic structure of anode interface with molybdenum oxide buffer layer", Organic Electronics 11, 2010, pp. 188-194.

I.N. Yakovkin et al., "Driving force for the $WO_3(001)$ surface relaxation", Surface Science 601, 2007, pp. 1481-1488.

J.B. Pedley et al., "Thermochemical Data for Gaseous Monoxides", Journal of Physical and Chemical Reference Data vol. 12, 1983, pp. 967-1031.

U.S. Appl. No. 13/736,285 to Seiji Nishiyama et al., filed Jan. 8, 2013.

U.S. Appl. No. 13/742,575 to Kenji Harada et al., filed Jan. 16, 2013.

U.S. Appl. No. 13/746,474 to Kenji Harada et al., filed Jan. 22, 2013.

International Search Report in PCT/JP2010/004959, dated Nov. 9, 2010.

International Search Report in PCT/JP2010/004954, dated Sep. 7, 2010.

International Search Report in PCT/JP2010/004960, dated Nov. 9, 2010.

International Search Report in PCT/JP2011/006448, dated Feb. 21, 2012.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

(56) References Cited

OTHER PUBLICATIONS

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

F. Bussolotti et al, "Surface electronic properties of polycrystalline WO3 thin films: A study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

\* cited by examiner

ORGANIC EL ELEMENT, DISPLAY APPARATUS, AND LIGHT-EMITTING APPARATUS

CROSS-REFERENCE TO RELATED APPLICATIONS

This is a continuation application of PCT Application No. PCT/JP2010/004212 filed on Jun. 24, 2010, designating the United States of America, the disclosure of which, including the specification, drawings and claims, is incorporated herein by reference in its entirety.

TECHNICAL FIELD

The present invention relates to an organic electric-field light-emitting element (hereinafter referred to as an "organic EL element"), which is an electric light emitter. The present invention also relates to a display apparatus and a light-emitting apparatus each having an organic EL element.

BACKGROUND ART

In recent years, progress is being made in research and development of diverse functional elements which involve the use of an organic semiconductor. One typical example of a functional element is an organic EL element. An organic EL element is a current-driven light emitter, and commonly has a pair of electrodes, namely an anode and a cathode, and functional layers layered between the pair of electrodes. The functional layers include a light-emitting layer composed of an organic material. Upon application of voltage across the pair of electrodes, holes injected from the anode to the functional layers recombine with electrons injected from the cathode to the functional layers. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as a light emitter or a light source for various display apparatuses.

To cause an organic EL element to emit light at high intensity, efficient injection of carriers (i.e., holes and electrons) from the electrodes to the functional layers is important. Generally, the provision of injection layers between each of the electrodes and a functional layer is effective in facilitating efficient injection of carriers. This is because an injection layer serves to lower the energy barrier to be overcome in the injection of carriers. An injection layer disposed between a functional layer and the anode is a hole-injection layer composed of an organic material, such as copper phthalocyanine or PEDOT (conductive polymer), or of a metal oxide, such as molybdenum oxide or tungsten oxide. An injection layer disposed between a functional layer and the cathode is an electron injection layer composed of an organic material, such as metal complex or oxadiazole, or of a metal, such as barium.

It has been reported that organic EL elements having a hole injection layer composed of a metal oxide, such as molybdenum oxide or tungsten oxide, exhibit improved hole injection efficiency and longevity (see Patent Literature 1 and Non-Patent Literature 1). It is further reported that the improvement achieved is relevant to the energy level resulting from structures similar to oxygen vacancies of metal oxide on the surface the hole injection layer (see Non-Patent Literature 2).

CITATION LIST

Patent Literature

[Patent Literature 1]
Japanese Patent Application Publication No. 2005-203339

Non-Patent Literature

[Non-Patent Literature 1]
Jingze Li et al., Synthetic Metals 151, 141 (2005)
[Non-Patent Literature 2]
Kaname Kanai et al., Organic Electronics 11, 188 (2010)
[Non-Patent Literature 3]
J. B. Pedley et al., Journal of Physical and Chemical Reference Data 12, 967 (1983)
[Non-Patent Literature 4]
I. N. Yakovkin et al., Surface Science 601, 1481 (2007)

SUMMARY OF INVENTION

Technical Problem

In the manufacturing of an organic EL element, problems are presented by adherents, mainly carbon-containing adherents, derived from molecules of carbon dioxide, water, and organic material contained in the atmosphere or from molecules of impurities generated during the manufacturing steps. To be more specific, in a step of laminating the respective layers, such as electrodes and a hole injection layer, of an organic EL element, if a layer with adherents on its surface is topped with another layer, the adherents are embedded between the layers. The presence of adherents involves the risk of increasing the drive voltage of, and/or reducing the longevity of the resulting organic EL element.

The present invention is made in view of the above problems and aims to provide an organic EL element, display apparatus, and light-emitting apparatus each operate at low voltage to emit light at high intensity.

Solution to Problem

In order to achieve the aim stated above, an organic EL element according to one aspect of the present invention includes: an anode and a cathode; and a hole injection layer and a functional layer layered between the anode and the cathode. The functional layer contains an organic material, and holes being injected to the functional layer from the hole injection layer. The hole injection layer contains a tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide contained in the hole injection layer satisfies a condition that a ratio in number density of atoms other than tungsten atoms and oxygen atoms to the tungsten atoms is equal to 0.83 or smaller.

Advantageous Effects of Invention

An organic EL element according to the above-described aspect of the present invention, the hole injection layer contains a tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide contained in the hole injection layer satisfies a condition that a ratio in number density of atoms other than tungsten atoms and oxygen atoms to the tungsten atoms is equal to 0.83 or smaller. This configuration achieves the clean surface of the hole injection layer, by removing adherents without affecting the energy level resulting from structures similar to oxygen vacancies of metal oxide on the surface of the hole injection layer. Thus, the organic EL element operates at low voltage to emit light at high intensity.

DESCRIPTION OF EMBODIMENTS

Figure 1:
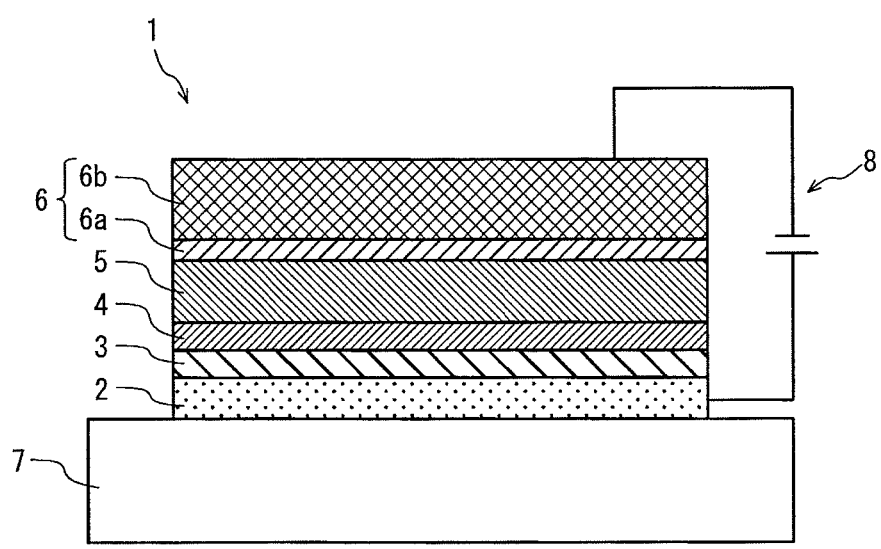
FIG. 1 is a schematic cross-sectional view illustrating a structure of an organic EL element pertaining to an embodiment of the present invention.

[Outline of Aspects of the Present Invention]

In order to achieve the aim stated above, a first aspect of the present invention provides an organic EL element that includes: an anode and a cathode; and a hole injection layer and a functional layer layered between the anode and the cathode. The functional layer contains an organic material, and holes being injected to the functional layer from the hole injection layer. The hole injection layer contains a tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide contained in the hole injection layer satisfies a condition that a ratio in number density of atoms other than tungsten atoms and oxygen atoms to the tungsten atoms is equal to 0.83 or smaller.

Furthermore, in a specific phase of the first aspect of the present invention directed to the organic EL element, in the UPS spectrum, the protrusion appears within the region corresponding to the binding energy range from 1.8 eV to 3.6 eV lower than the top of the valence band.

Note that a numerical range stated as "from . . . to . . . " is intended to mean that the upper and lower limits are both inclusive. For example, the numerical range "from 1.8 eV to 3.6 eV" includes both 1.8 eV and 3.6 eV.

Furthermore, in another specific phase of the first aspect of the present invention directed to the organic EL element, the ratio in number density of the other atoms to the tungsten atoms is equal to 0.62 or smaller. In this phase, the adherent removal effect is assumed to have reached a level of saturation, so that a sufficient adherent removal effect is expected to be achieved.

Furthermore, in a yet another specific phase of the first aspect of the present invention directed to the organic EL element, the other atoms are carbon atoms.

Furthermore, in a yet another specific phase of the first aspect of the present invention directed to the organic EL element, the hole injection layer has been irradiated with ultraviolet light so that the hole injection layer exhibits: by UPS measurement, the UPS spectrum having the protrusion appearing near the Fermi surface and within the region corresponding to the binding energy range lower than the top of a valence band; and by XPS measurement, that the tungsten oxide contained in the hole injection layer satisfies the condition that the ratio in number density of atoms other than tungsten atoms and oxygen atoms to the tungsten atoms is equal to 0.83 or smaller.

A second aspect of the present invention provides an organic EL element organic EL element that includes: an anode and a cathode; and a hole injection layer and a functional layer layered between the anode and the cathode. The functional layer contains an organic material, and holes being injected to the functional layer from the hole injection layer. The hole injection layer contains a tungsten oxide and exhibits, in UPS measurement, a UPS spectrum having: a protrusion appearing near a Fermi surface and within a region corresponding to a binding energy range lower than the top of a valence band; and a peak appearing within a region corresponding to a binding energy range from 4.5 eV to 5.4 eV.

Furthermore, in a specific phase of the second aspect of the present invention directed to the organic EL element, in the UPS spectrum, the protrusion appears within the region corresponding to the binding energy range from 1.8 eV to 3.6 eV lower than the top of the valence band.

Furthermore, in another specific phase of the second aspect of the present invention directed to the organic EL element, the hole injection layer has been irradiated with ultraviolet light so that the hole injection layer exhibits, in UPS measurement, the UPS spectrum having: the protrusion appearing near the Fermi surface and within the region corresponding to the binding energy range lower than the top of the valence band; and the peak appearing within the region corresponding to the binding energy range from 4.5 eV to 5.4 eV.

A third aspect of the present invention provides an organic EL element that includes: an anode and a cathode; and a hole injection layer and a functional layer layered between the anode and the cathode. The functional layer contains an organic material, and holes being injected to the functional layer from the hole injection layer. The hole injection layer contains a molybdenum oxide and exhibits, in UPS measurement, a UPS spectrum having: a protrusion appearing near a Fermi surface and within a region corresponding to a binding energy range lower than the top of a valence band; and a peak appearing within a region corresponding to a binding energy range from 3.7 eV to 5.2 eV.

A specific phase of the third aspect of the present invention directed to the organic EL element, in the UPS spectrum, the protrusion appears within the bonding energy range that is from 1.2 eV to 3.0 eV lower than the top of the valance band.

Furthermore, in another specific phase of the third aspect of the present invention directed to the organic EL element, the hole injection layer has been irradiated with ultraviolet light so that the hole injection layer exhibits, in UPS measurement, the UPS spectrum having: the protrusion appearing near the Fermi surface and within the region corresponding to the binding energy range lower than the top of the valence band; and the peak appearing within the region corresponding to the binding energy range from 3.7 eV to 5.2 eV.

[Developments Leading to the Present Invention]

With the aim of preventing increase in drive voltage of the organic EL element and reduction in longevity of the organic EL element, the present inventors have come to a technical idea of adding, to the manufacturing process, a cleaning step of removing adherents from the layer surfaces subsequently to the formation of the respective layers.

As the cleaning methods for removing adherents, the present inventors have turned their attention to ultraviolet (UV) ozone cleaning and oxygen plasma cleaning, which are widely used for cleaning glass substrates and electrodes, for the high degree of cleanliness achieved thereby.

Intensive studies by the present inventors on the cleaning methods have revealed that neither UV ozone cleaning nor oxygen plasma cleaning is suitable for cleaning the hole injection layer of an organic EL element, provided that the hole injection layer is composed of a metal oxide, such as molybdenum oxide or tungsten oxide.

The reason is as follows. Both the UV ozone cleaning and oxygen plasma cleaning utilize strong oxidation associated with oxygen radicals formed by decomposition of oxygen molecules. Through the oxidation, oxygen atoms end up filling structures similar to oxygen vacancies of metal oxide on the surface of the hole injection layer. Consequently, the energy level resulting from structures similar to oxygen vacancies disappears from the hole injection layer composed of metal oxide. As a result, there is a risk of decreasing the hole injection efficiency. To be more precise, the present inventors have confirmed, by experiments described below, that the energy level resulting from structures similar to oxygen vacancies almost completely disappear through UV ozone cleaning.

Based on the above findings, the present inventors have recognized the importance of the following two points in order to prevent increase in the drive voltage of, and decrease in the longevity of an organic EL element having a hole injection layer composed of a metal oxide. One of the points is that the energy level resulting from structures similar to oxygen vacancies of metal oxide on the surface of the hole injection layer remains without being eliminated. The other of the points is that adherents are removed from the surface the hole injection layer.

After a series of researches and studies regarding the above features of the present invention, the present inventors came to be aware of Non-Patent Literature 1 disclosing UV ozone cleaning performed subsequently to the formation of a hole injection layer composed of tungsten oxide. However, Non-Patent Literature 1 discloses nothing about the impact on the characteristics of the organic EL element imposed by UV ozone cleaning and nothing about optimizing the conditions of UV ozone cleaning. It is further noted that Non-Patent Literature 1 does not describe anything about the fact, which are found by the present inventors through specific studies, that UV ozone cleaning is not suitable for cleaning a hole injection layer composed of tungsten oxide unless adequately modified. Naturally, Non-Patent Literature 1 does not describe anything about the technical reasons for the unsuitability.

As another method for removing adherents, the following discusses sputter etching of performing argon ion sputtering in a vacuum chamber subsequently to a hole injection layer is formed. The sputter etching has been reported to remove adherents and also to increase the energy level resulting from structures similar to oxygen vacancies. Thus, the sputter etching appears to be an excellent cleaning method at first.

Unfortunately, the clean surface and the increased energy level obtained by the sputter etching can be maintained only in the vacuum chamber for the following reason. That is, the surface of a hole injection layer treated by sputter etching in vacuum is highly instable because the molecular bonds have been forcedly broken by an ion beam. Therefore, once taken out of the vacuum chamber, the hole injection layer easily adsorbs atmospheric molecules to be stabilized. In the manner described above, structures similar to oxygen vacancies of metal oxide which are created in vacuum are instantly filled, and the layer surface once cleaned rapidly adsorbs contaminants.

The layer surface may be kept clean by performing some or all of the subsequent manufacturing steps continuously inside the vacuum chamber. However, performing manufacturing steps inside a vacuum chamber is applicable, on condition that the organic EL panel to be manufactured is relatively small. For a large-sized organic EL panel having display size of e.g., around 50 inches, it is extremely difficult to perform the manufacturing steps inside a vacuum chamber as the vacuum chamber needs to be large enough for such a large-sized organic EL panel. Besides, the throughput of steps performed inside a vacuum chamber is small, and such steps are not desirable for mass production.

Alternatively to removing adherents, a method of preventing adhesion of contaminants per se is one possibility. For example, by performing some or all of manufacturing steps subsequent to the layer formation continuously inside a vacuum chamber, the respective layers are exposed neither to the atmosphere nor to impurity molecules. Thus, the layer surface is kept free or substantially free of contaminants. However, this scheme is extremely difficult to apply to the manufacturing of large-sized organic EL panels because the vacuum chamber of a corresponding size is required as already described above.

Alternatively, performing manufacturing steps inside a chamber filled with inert gas is another possibility. This scheme is applicable to the manufacturing of large-sized organic EL panels. Unfortunately, such a chamber still contains impurity molecules and the like, although the amount is smaller than that in the atmosphere. In addition, complete removal of such molecules from the chamber is difficult.

As has been described above, it is extremely difficult to obtain an organic EL element having a hole injection layer satisfying that (i) the energy level resulting from structures similar to oxygen vacancies of metal oxide on the layer surface remains without being eliminated and (ii) the surface of the hole injection layer is free or substantially free of adherents.

In contrast, an organic EL element according to one aspect of the present invention includes a hole injection layer having an energy level resulting from structures similar to oxygen vacancies of metal oxide on the surface of the hole injection layer remains without being eliminated. Therefore, holes are injected from the anode to the functional layer with efficiency. Consequently, the organic EL element emits light at low power consumption and high intensity. In addition, since adherents have been removed from the surface of the hole injection layer, no or substantially no contaminants are embedded between the hole injection layer and the functional layers. As a consequence, the drive voltage of the organic EL element is not increased and no carrier traps, such as impurities derived from adherents, are formed, which ensures a long life and favorable characteristics of the organic EL element.

[Embodiments]

The following describes an organic EL element, a manufacturing method therefor, a display apparatus, and a light-emitting apparatus all according to one aspect of the present invention. Subsequently, the results of experiments conducted to confirm the performance of the organic EL element are described, followed by observations on the experimental results. Note that each figure is illustrated on a reduced scale different from the proportion of the actual sizes.

<Structure of Organic EL Element>

FIG. 1 is a schematic cross-sectional view illustrating the structure of an organic EL element 1 pertaining to an embodiment of the present invention.

The organic EL element 1 is, for example, an application-type organic EL element, which has functional layers formed by applying raw material by a wet process. The organic EL element 1 includes a hole injection layer 3, various functional layers (a buffer layer 4 and a light-emitting layer 5, in this embodiment) each containing a functional material having a predetermined function, and a pair of electrodes, namely an anode 2 and a cathode 6. The hole injection layer 3 and the functional layers are layered between the pair of electrodes.

More specifically, the organic EL element 1 includes, as illustrated in FIG. 1, the anode 2, the hole injection layer 3, the buffer layer 4, the light-emitting layer 5, and the cathode 6 (composed of a barium layer 6a and an aluminum layer 6b), which are layered in the stated order on one main surface of a substrate 7.

(Hole Injection Layer)

In one example, the hole injection layer 3 is a thin film (layer) having a thickness of 30 nm and composed of tungsten oxide, which is a metal oxide. In the formula (WOx) representing the composition of tungsten oxide, x is a real number generally falling within the range of $2<x<3$. It is preferable that the hole injection layer 3 consist only of tungsten oxide. However, the inclusion of a trace level of impurities is acceptable, provided that the amount does not exceed the amount of impurities which may be incorporated as a result of normal processing.

By being formed under the predetermined conditions, the resulting hole injection layer 3 is ensured to have, on its surface, the energy level resulting from structures similar to oxygen vacancies of the metal oxide. The presence of the energy level enables effective hole injections. In addition, subsequently to the layer formation, the hole injection layer 3 is irradiated with ultraviolet light of a predetermined wavelength in the atmosphere. As a result of the ultraviolet (UV) irradiation, the surface of the hole injection layer 3 is cleaned to reduce adherents thereon, without affecting the energy level resulting from the structures similar to oxygen vacancies of metal oxide. In addition, the duration and intensity of UV irradiation is set so that, with respect to a photoelectron spectrum exhibited by the hole injection layer 3 after the UV irradiation, changes in shape of a spectral region corresponding to a predetermined range of binding energy converge. With the setting, the maximum effect of removing adherents is achieved by UV irradiation performed at the minimum conditions.

(Buffer Layer)

In one example, the buffer layer 4 is a 20 nm-thick layer of TFB (poly(9,9-di-n-octylfluorene-alt-(1,4-phenylene-((4-sec-butylphenyl)imino)-1,4-phenylene)), which is an amine-containing organic polymer.

(Light-Emitting Layer)

In one example, the light-emitting layer 5 is a 70 nm-thick layer of F8BT (poly(9,9-di-n-octylfluorene-alt-benzothiadiazole)), which is an organic polymer. However, the material of the light-emitting layer 5 is not limited to this, and the light-emitting layer 5 may contain a commonly-known organic material. Examples of such commonly-known organic material for the light-emitting layers 5 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Functional Layers)

A functional layer according to the present invention refers to one of: a hole transport layer that transfers holes; a light-emitting layer that emits light as a result of recombination of injected holes and electrons; and a buffer layer used for adjusting optical characteristics of the organic EL element 1 or for blocking electrons. Alternatively, functional layers according to the present invention may refer to a combination of two or more of, or all of the above-mentioned layers. Although the present invention is directed to a hole injection layer, an organic EL element commonly includes layers having the functions of the hole transport layer, light-emitting layer and the like described above, in addition to the hole injection layer. As such, the expression "functional layers" refers to all such layers which need to be included in the organic EL element, aside from the hole injection layer to which the present invention is directed.

(Other)

In one example, the anode 2 is a thin ITO film having a thickness of 50 nm. In one example, the cathode 6 includes the barium layer 6a of 5 nm-thick and the aluminum layer 6b of 100 nm-thick, which are layered one on top of the other. The anode 2 and the cathode 6 are connected to a direct current (DC) voltage source 8 to supply power to the organic EL element 1 from the outside.

In one example, the substrate 7 may be formed with one of insulating materials, such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

(Effects and Advantages Produced by the Organic EL Element)

As described above, the hole injection layer 3 of the organic EL element 1 contains tungsten oxide, which is a metal oxide. In addition, after the formation of the hole injection layer 3, a surface thereof is exposed to ultraviolet light of a predetermined wavelength. As a result, adherents on the surface of the holes injection layer 3 have been removed to a maximum, without affecting the energy level resulting from structures similar to oxygen vacancies present in metal oxide. This enables the organic EL element to be driven with low drive voltage and have longevity.

<Structure of Display Apparatus>

Figure 2:
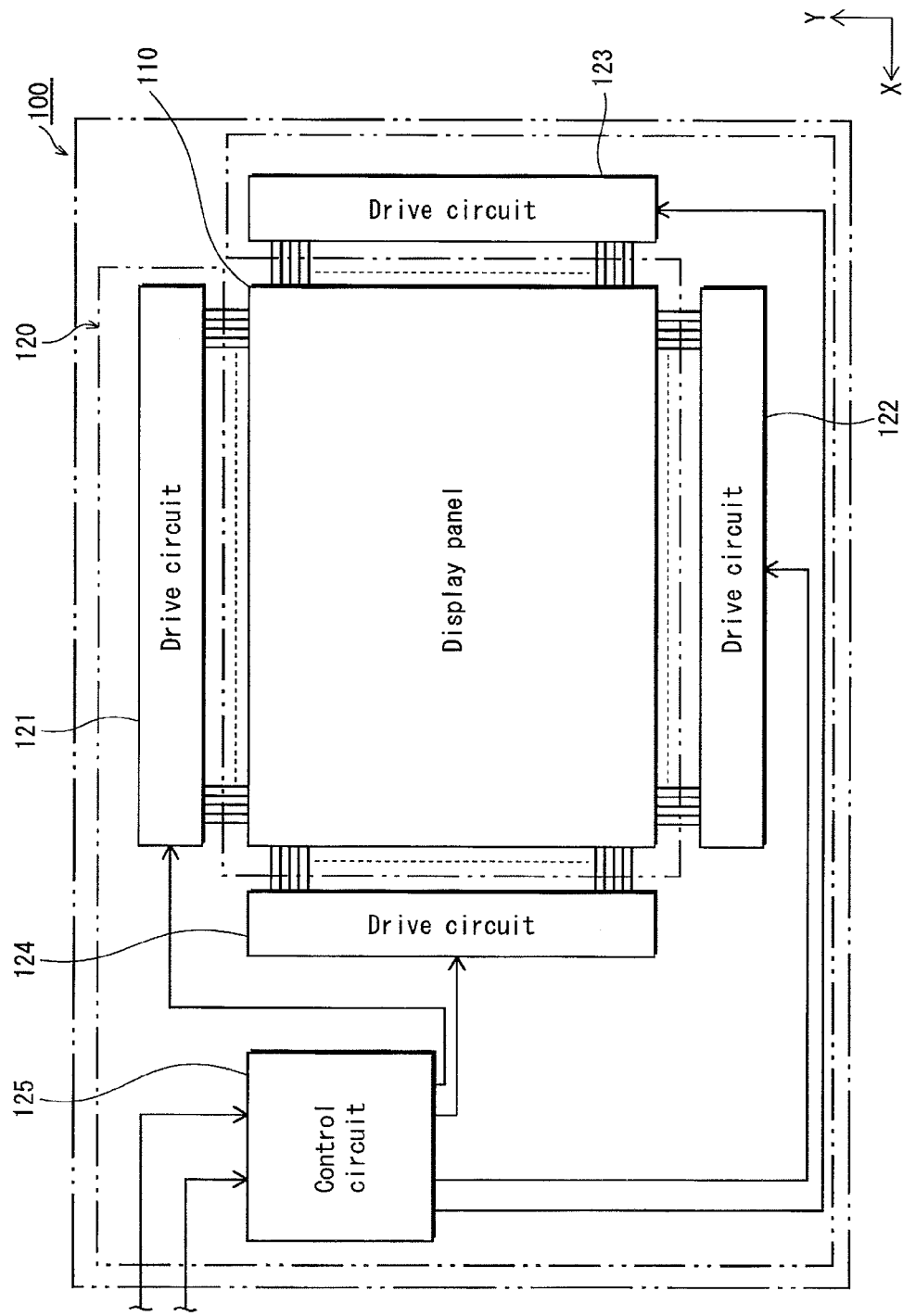
FIG. 2 is a view illustrating an overall structure of a display apparatus according to one aspect of the present invention.
Figure 3A:
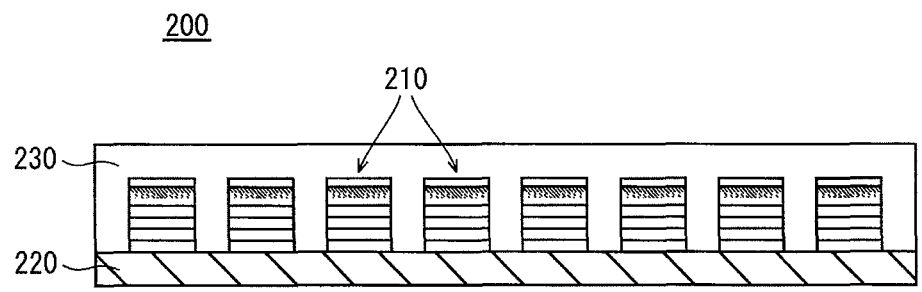
FIG. 3A is a longitudinal sectional view illustrating a light-emitting apparatus according to one aspect of the present invention.
Figure 3A:
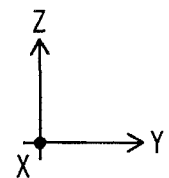
Figure 3B:
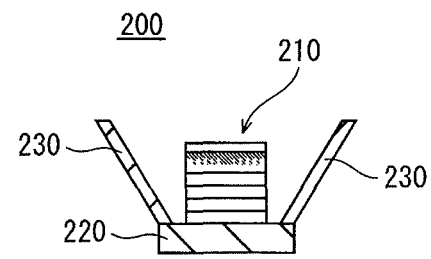
FIG. 3B is a transverse sectional view illustrating the light-emitting apparatus.
Figure 3B:
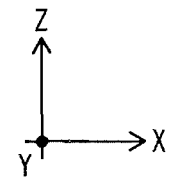

With reference to FIG. 2, the following describes a display apparatus according to one aspect of the present invention. FIG. 2 is a view illustrating an overall structure of the display apparatus according to the aspect of the present invention.

As illustrated in FIG. 2, the display apparatus 100 includes a display panel 110 having organic EL elements manufactured by the method according to one aspect of the present invention and also includes a drive control unit 120 connected to the display panel 100. The display apparatus 100 may be used, for example, in a display, television, and mobile phone. The drive control unit 120 includes four drive circuits 121-124 and a control circuit 125. However, in an actual display apparatus 100, the arrangement and connection of the drive control unit 120 with respect to the display panel 110 is not limited to as described above.

The display apparatus 100 having the above structure is excellent in its image quality owing to the excellent light-emitting characteristics of the organic EL elements.

<Structure of Light-Emitting Apparatus>

FIG. 3 illustrate a light-emitting apparatus according to one aspect of the present invention. More specifically, FIG. 3A is a longitudinal sectional view, whereas FIG. 3B is a transverse sectional view. As shown in FIGS. 3A and 3B, the light-emitting apparatus 200 includes: organic EL elements 210 manufactured by the method according to the aspect of the present invention; a base 220 having the organic EL elements 210 mounted on its upper surface; and a pair of reflecting members 230 disposed to flank an array of the organic EL elements 210. The light-emitting apparatus 200 may be used as an illuminator and a light source. The organic EL elements 210 are electrically connected to a conductive pattern (not illustrated) formed on the base 220 and emit light on power supplied via the conductive pattern. Part of light emitted from the organic EL elements 210 is reflected by the reflecting members 230, whereby the light distribution is controlled.

The light-emitting apparatus 200 having the above structure is excellent in its image quality owing to the excellent light-emitting characteristics of the organic EL elements.

(Manufacturing Method of Organic EL Elements)

Figure 4A:
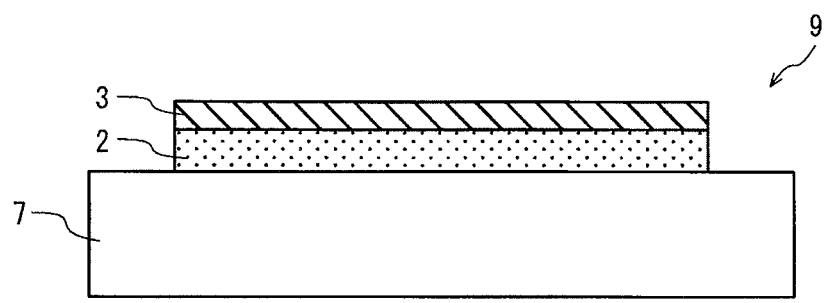
FIGS. 4A, 4B, and 4C are views illustrating important parts of a method for manufacturing the organic EL element according to the embodiment.
Figure 4B:
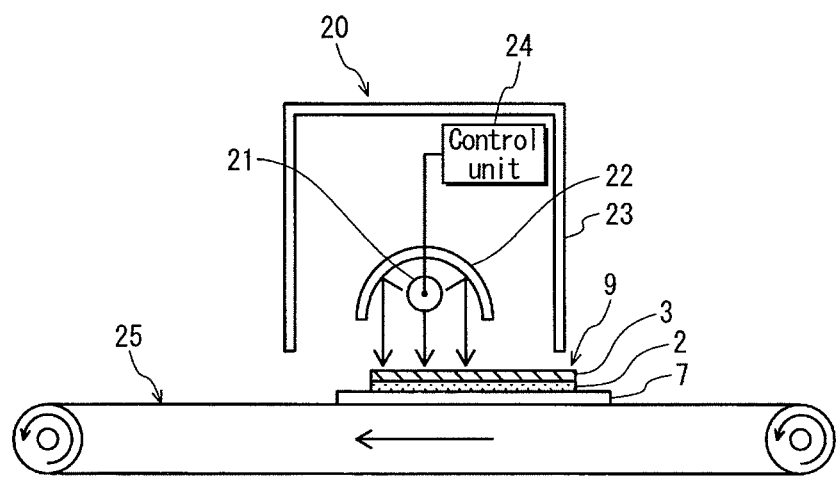
Figure 4C:
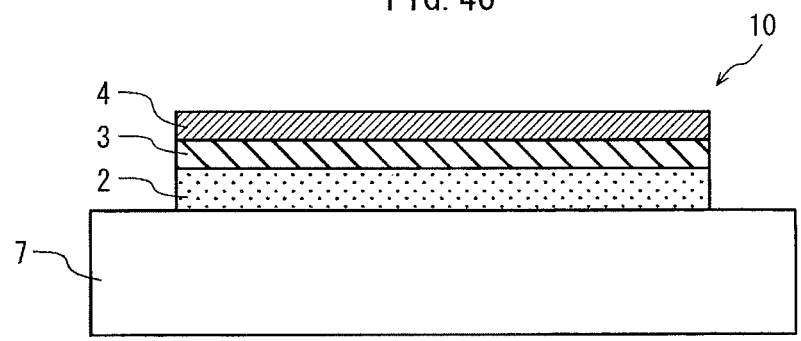

The following describes a method for manufacturing the organic EL element 1 with reference to FIG. 4. FIGS. 4A, 4B, and 4C are views illustrating important parts of the method for manufacturing an organic EL element according to the embodiment.

Firstly, the substrate 7 is placed inside the chamber of a sputtering film-forming apparatus. Then, a predetermined sputtering gas is introduced into the chamber to form the 50 nm-thick anode 2 composed of ITO by reactive sputtering.

Next, the hole injection layer 3 is formed also by reactive sputtering. More specifically, after replacing the target with metal tungsten, reactive sputtering is performed. An argon gas and an oxygen gas are introduced into the chamber as the sputtering gas and the reactive gas, respectively. Under this state, high voltage is applied to ionize the argon, so that the ionized argon is caused to bombard the sputtering target. The metal tungsten thus sputtered reacts with the oxygen gas to form tungsten oxide, which is then deposited on the anode 2 previously formed on the substrate 7. As a result, the hole injection layer 3 is formed. FIG. 4A shows an intermediate product 9 obtained at this stage of manufacturing.

The film formation described above is performed under the following conditions: (i) the substrate temperature is not controlled; (ii) gas pressure (total gas pressure) is equal to 2.3 Pa; (iii) the ratio of oxygen partial pressure to the total gas pressure is equal to 50%; and (iv) input power per unit surface area of the sputtering target (input power density) is equal to 1.2 W/cm$^2$. The hole injection layer 3 composed of tungsten oxide formed under the above conditions has the energy level resulting from structures similar to oxygen vacancies on its surface.

Subsequently to the layer formation, the substrate 7 is taken out of the chamber to the atmosphere. At this point, the hole injection layer 3 is exposed to the atmosphere and thus adsorbs gas molecules on its exposed surface. It is also assumed that once the hole injection layer 3 is formed, impurity molecules present in the chamber adhere to the layer surface even before the substrate 7 is taken out of the chamber.

Next, as illustrated in FIG. 4B, the step of UV irradiation is performed in the atmosphere to expose the surface of the hole injection layer 3 to ultraviolet light. In this step, an ultraviolet (UV) irradiation apparatus 20 according to one aspect of the present invention is used. The UV irradiation apparatus 20 has a metal halide lamp manufactured by Ushio Inc. (Model No.: UVL-3000M2-N) as a light source 21. The UV irradiation apparatus 20 will be described later in detail. The irradiation conditions are separately determined by experiments conducted using photoemission spectroscopy measurements, which will be described later. Specifically, the irradiation conditions are determined so that changes in shape of the resulting photoelectron spectrum in a spectral region corresponding to a predetermined binding energy range converge. In this embodiment, the irradiation intensity is determined to be 155 mW/cm$^2$ and the irradiation duration is determined to be 10 minutes.

Next, an ink composition containing an organic amine-containing molecular material is dripped onto the surface of the hole injection layer 3 by a wet process, such as a spin coat method or inkjet method, followed by removal of the solvent of the ink composition by volatilization. As a result, the buffer layer 4 is formed, and thus an intermediate product 10 as illustrated in FIG. 4C is obtained.

Next, an ink composition containing an organic light-emitting material is dripped onto the surface of the buffer layer 4 by a similar method as in the forming of the hole injection layer 3, followed by removal of the solvent of the ink composition by volatilization. Thus, the light-emitting layer 5 is formed.

Note that the method employed to form the buffer layer 4 and the light-emitting layer 5 is not limited to the specific method described above. Alternatively, the ink may be dripped or applied by any other method than the spin coat method or inkjet method. Examples of such alternative methods include a dispenser method, nozzle coating method, intaglio printing method, and relief printing method.

Subsequently, the barium layer 6$a$ and the aluminum layer 6$b$ are formed on the exposed surface of the light-emitting layer 5 by a vacuum vapor deposition method. Thus, the cathode 6 is formed.

Although not illustrated in FIG. 1, the organic EL element 1 may additionally have a sealing layer on the surface of the cathode 6 or a sealing cap to isolate the entire organic EL element 1 from external space. Such a sealing layer or sealing cap prevents the organic EL element 1 after the completion from being exposed to the atmosphere. The sealing layer may be formed, for instance, of materials such as SiN (silicon nitride) and SiON (silicon oxynitride), and may be disposed to encapsulate the organic EL element 1 therein. When a sealing cap is additionally provided, the sealing cap may be formed of, for instance, the same material as the substrate 7, and a getter which absorbs moisture and the like may be provided within the space enclosed by the sealing cap.

Through the manufacturing steps described above, the organic EL element 1 is completed.

(Effects Achieved by Manufacturing Method of Organic EL Element)

The above-described manufacturing method of the organic EL element 1 involves the UV irradiation step of radiating ultraviolet light having the predetermined wavelength, performed after the hole injection layer 3 of tungsten oxide is formed. With the step, adherents on the surface of the hole injection layer 3 are removed, while the energy level resulting from structures similar to oxygen vacancies of metal oxide is maintained on the hole injection layer surface.

Furthermore, the energy level mentioned above is continuously maintained in the atmosphere throughout the time from the cleaning of the hole injection layer 3 to the formation of the buffer layer 4. Consequently, the ability of hole injection is maintained with stability. This ensures the stable manufacturing of the organic EL element 1 that is driven with low drive voltage and has longevity.

Furthermore, the duration of UV irradiation and the intensity of ultraviolet light in the UV irradiation step are determined in view of the conditions with which, with respect to a photoelectron spectrum exhibited by the hole injection layer 3, changes in shape of a spectral region corresponding to a predetermined binding energy range converge. That is, the irradiation conditions are determined to achieve the maximum removable of adherents with the minimum conditions. Thus, the highly stable hole injection efficiency is realized with a minimum cleaning process.

<Experiments and Observations>

(Effect of Adherents Removal by UV Irradiation)

According to this embodiment, subsequently to its formation, the hole injection layer 3 composed of tungsten oxide is exposed to ultraviolet light under the predetermined conditions, whereby adherents are removed from the surface of the hole injection layer 3. The adherent removal effect achieved by the UV irradiation is confirmed by the following experiments.

By the manufacturing method according to the present embodiment, samples were prepared each by laminating the anode 2 composed of ITO on the substrate 7, and the hole injection layer 3 composed of tungsten oxide on the anode 3, in the chamber of the sputtering film-forming apparatus. After the lamination, each intermediate sample was taken out of the chamber to the atmosphere to prepare samples without any UV irradiation, samples with UV irradiation for one minute, and samples with UV irradiation for ten minutes. The irradiation intensity was 155 mW/cm$^2$.

In the following description in the present embodiment, a sample without UV irradiation may be referred to as a "no-irradiation sample" and a sample with UV irradiation for n minutes may be referred to as an "n-minute irradiation sample".

Each sample was then attached to a photoelectron spectroscopy apparatus (PHI 5000 VersaProbe) manufactured by ULVAC-PHI, Incorporated to measure the X-ray photoelectron spectroscopy (XPS). Generally, an XPS spectrum indicates the elemental composition, binding condition, and valence of the target surface up to several nanometers in depth. That is, if elements not originally contained in tungsten oxide are observed, it is highly likely that the elements are adherents. In addition, it is generally known that molecules adhere as a result of atmospheric exposure or during a manufacturing process are mainly carbon-containing molecules, if water molecules and oxygen molecules are excluded. Therefore, the adherents removal effect achieved is confirmed by measuring changes in the carbon concentration in the surface region of the hole injection layer 3.

The conditions under which the XPS measurement was conducted are as follows. Note that no charge-up occurred during the measurement.

Light source: Al K α
Bias: None
Electron emission angle: Normal line direction to the substrate surface First, each sample was subjected to wide-scan measurement. As a result of the measurement, the only elements found in each sample were tungsten (W), oxygen (O), and carbon (C). Then, narrow-scan spectra of each sample were measured for the W 4f orbital (W4f) and also for the C1s orbital (C1s) to obtain the relative value of the number density of carbon atoms to the number of density of tungsten atoms present in the surface region up to several nanometers in depth of the hole injection layer 3 composed of tungsten oxide. That is, the composition ratio between W and C was obtained. The composition ratio was obtained from the spectra, by using the composition ratio calculation function of "MultiPak" XPS, which is analyzing software included with the photoelectron spectroscopy apparatus used in the measurements.

Table 1 below shows the composition ratio between W and C of each sample.

TABLE 1

| Sample Name | Composition Ratio between W and C (W:C) |
|---|---|
| No-Irradiation Samples | 1:1.27 |
| 1-Minute Irradiation Samples | 1:0.83 |
| 10-Minute Irradiation Samples | 1:0.62 |

With reference to Table 1, the number of carbon atoms relative to the number of tungsten atoms decrease more and more as the irradiation duration is longer, which is apparent when comparing the samples without irradiation against the samples with 1-minute irradiation and the samples with 10-minute irradiation. That is, it is made clear that the UV irradiation according to the present embodiment serves to decrease adherents on the surface of the hole injection layer 3 composed of tungsten oxide.

(Influences of Uv Irradiation on Hole Injection Ability)

According to the present embodiment, the UV irradiation is performed to remove adherents from the surface of the hole injection layer 3 composed of tungsten oxide, in a manner that the energy level resulting from structures similar to oxygen vacancies is maintained without any substantial influence. Note that the structures similar to oxygen vacancies favorably affect the hole injection ability. This property of maintaining structures similar to oxygen vacancies is confirmed by the following experiments.

In the experiments, the above-described samples without irradiation, with 1-minute irradiation, and with 10-minute irradiation were subjected to UPS (ultraviolet photoelectron spectroscopy) measurements. Generally, a UPS spectrum indicates the electronic state, from the valence band to the Fermi surface (Fermi level), of the measurement target surface of up to several nanometers in depth. Especially in the case where the measurement target is tungsten oxide or molybdenum oxide, the presence of structures similar to oxygen vacancies on the layer surface is indicated by a protrusion appearing, in a UPS spectrum, near the Fermi surface in the low binding energy direction from the top of the valence band (hereinafter, such a protrusion is referred to as a "spectral protrusion near the Fermi surface") (Non-Patent Literature 2 and 3). That is, by observing changes in the spectral protrusion near the Fermi surface before and after UV irradiation, the influence imposed by the UV irradiation on the structures similar to oxygen vacancies on the layer surface is examined. In tungsten oxide, the spectral protrusion near the Fermi surface occupies a binding energy range that is from 1.8 eV to 3.6 eV lower than the top of the valence band (the lowest binding energy within the valence band).

The conditions under which the UPS measurement was conducted are as follows. Note that no charge-up occurred during the measurement.

Figure 5:
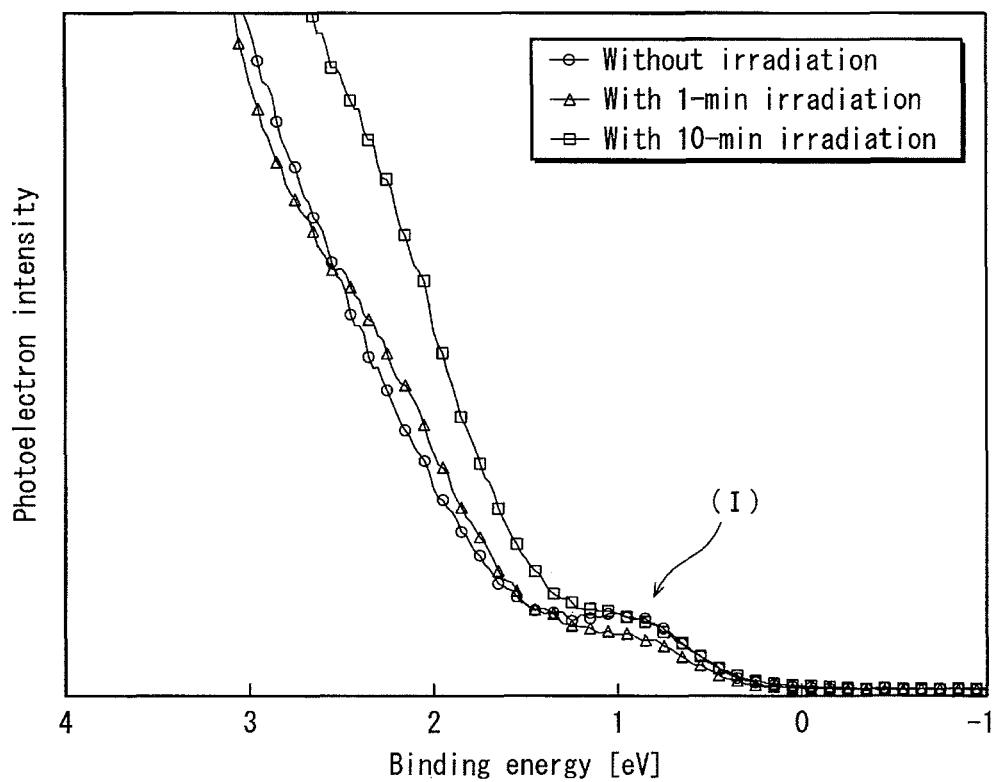
FIG. 5 is a view illustrating UPS spectra of tungsten oxide.

Light source: He I
Bias: None
Electron emission angle: Normal line direction to the substrate surface FIG. 5 shows the UPS spectra of the respective samples, focusing on portions near the Fermi surface. In the following description, every photoelectron spectroscopy spectrum (UPS and XPS) is shown with the horizontal axis representing the binding energy having the origin point in the Fermi surface and with the left direction relative to the origin point being positive. In all the spectra measured on the samples without irradiation, with 1-minute irradiation, and with 10-minute irradiation, a spectral protrusion near the Fermi surface is clearly observed. In the figure, spectral protrusions near the Fermi surface are collectively denoted by (I). These results indicate that the structures similar to oxygen vacancies favorably affecting the hole-injection ability are maintained even after the UV irradiation.

For the purpose of comparison, UV ozone cleaning was also performed. More specifically, samples were prepared each by laminating the anode 2 composed of ITO on the substrate 7, and the hole injection layer 3 composed of tungsten oxide on the anode 3, in the chamber of a sputtering film-forming apparatus. The intermediate samples were than taken out of the chamber to the atmosphere, followed by UV ozone cleaning of the surface of the hole injection layer 3 by a UV ozone apparatus. The samples after the UV ozone cleaning were subjected to UPS measurement to check the presence of a spectral protrusion near the Fermi surface.

Figure 6:
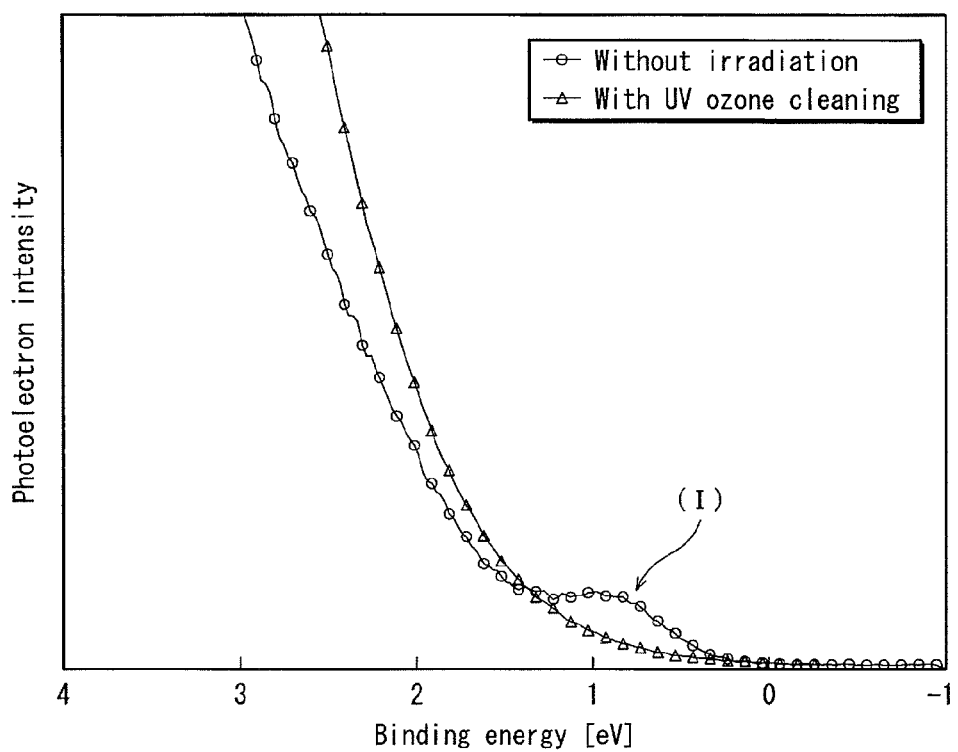
FIG. 6 is a view illustrating UPS spectra of tungsten oxide.

FIG. 6 illustrates the UPS spectrum measured on the hole injection layer 3 composed of tungsten oxide having been subjected to the UV ozone cleaning for three minutes, focusing on a portion near the Fermi surface. For the purpose of comparison, FIG. 6 also illustrates the UPS spectrum of the samples without irradiation, which is illustrated in FIG. 5. Different from the results shown in FIG. 5 regarding the samples subjected to the UV irradiation according to the present embodiment, no spectral protrusion near the Fermi surface is observed at all. The results indicate that through the UV ozone cleaning, almost all structures similar to oxygen vacancies are lost from the surface of the hole injection layer 3.

As described above, it is clarified that cleaning by the UV irradiation according to the present embodiment is different from the UV ozone cleaning in that structures similar to oxygen vacancies are maintained without being lost. That is, structures similar to oxygen vacancies, which favorably affect the hole injection ability, are not eliminated by the UV irradiation.

(Regarding Method for Determining Uv Irradiation Conditions)

According to the present embodiment, the surface of the hole injection layer 3 composed of tungsten oxide is cleaned by UV irradiation. It is confirmed by the following experimental results that the adherent removal effect becomes saturated with the irradiation for a specific duration or longer.

Figure 7:
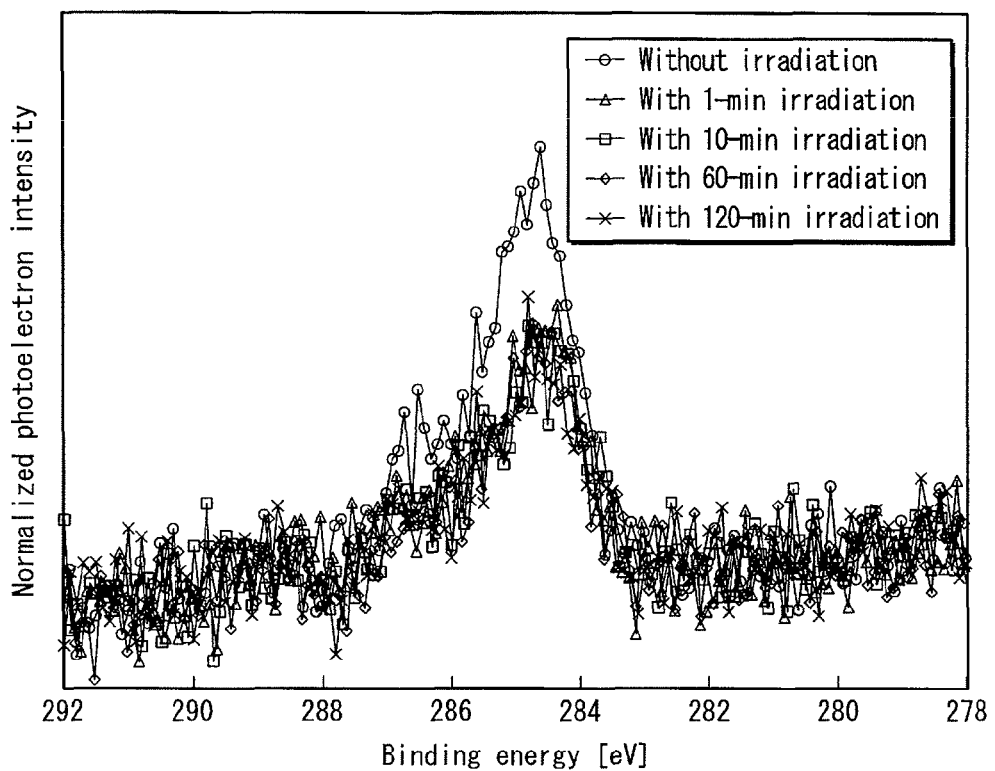
FIG. 7 is a view illustrating XPS spectra of tungsten oxide.

In the same manner as described above, samples without irradiation, with 1-minute irradiation, and with 10-minute irradiation were prepared. In addition, samples with 60-minute irradiation and 120 minute irradiation were prepared. Then, narrow-scan spectra for W4f and C1s of the respective samples were measured by XPS measurement. From the respective spectra, background components are subtracted. Then, the photoelectron intensity is normalized using the intensities by the area intensity. The narrow-scan spectra for C1s of the respective samples are shown in FIG. 7. The area intensity of each C1s spectrum illustrated in FIG. 7 is proportional to the ratio of the number density of carbon atoms to the number density of tungsten atoms, all of which were present in the surface region of the hole injection layer 3 composed of tungsten oxide up to several nanometers in depth from the layer surface.

According to FIG. 7, the C1s spectra measured on the samples with 1-minute irradiation or longer are all substantially equal in intensity. This indicates that the adherent removal effect has substantially reached a level of saturation with the irradiation for the duration of one minute or longer.

Generally, a C1s spectrum tends to be low in intensity and roughly irregular as shown in FIG. 7, because the amount of adherents is intrinsically small. Therefore, C1s spectra may not serve the best in determining saturation of the adherent removal effect. In view of this, the following describes other methods involving the use of spectra of relatively strong intensity, for determining saturation of the adherent removal effect.

The first of such a method is to make a saturation determination based on changes in the shape of a UPS spectral region corresponding to a range of binding energy around the top of the valence band (i.e., the UPS spectral region corresponding to the binding energy range from 4.5 eV to 5.4 eV). A peak or shoulder appearing in the spectral region indicates a lone pair of electrons in the 2p orbital in oxygen atoms constituting tungsten oxide.

Figure 8:
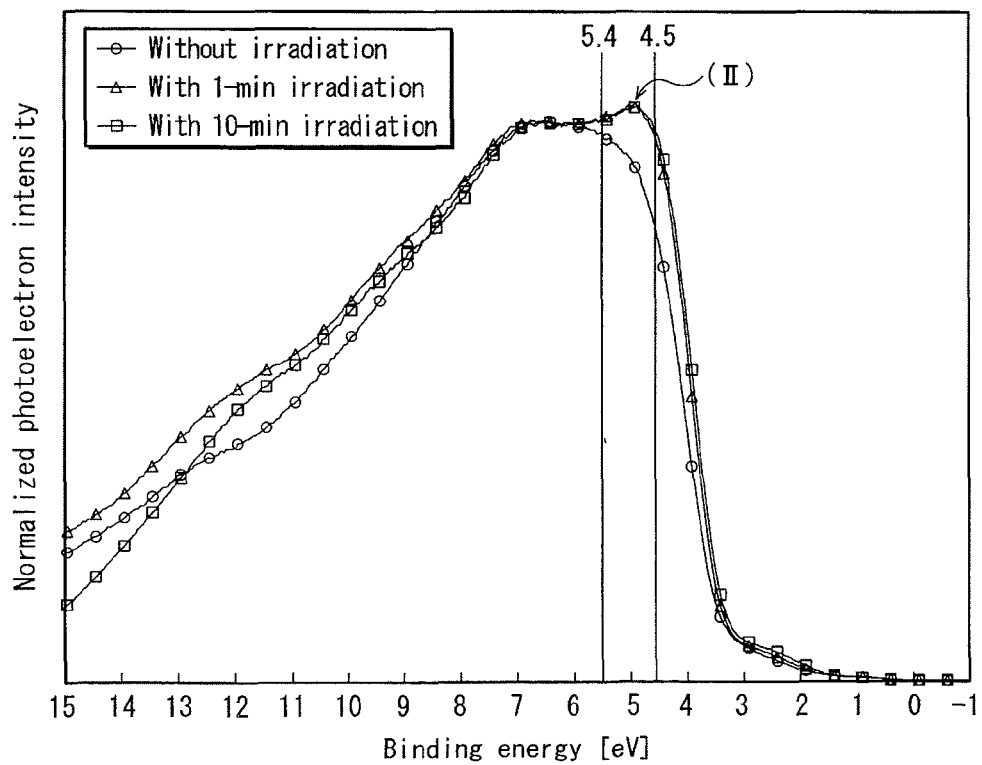
FIG. 8 is a view illustrating UPS spectra of tungsten oxide.

FIG. 8 illustrates the UPS spectra. The UPS measurements were made on the respective samples without irradiation, with 1-minute irradiation, and with 10-minute irradiation. The photoelectron intensity is normalized using a gentle peak appearing around the binding energy of 6.5 eV. As shown in FIG. 8, the spectra measured on samples with 1-minute irradiation and with 10-minute irradiation both have a clear peak (denoted by (ii) in the figure) appearing in the binding energy range from 4.5 eV to 5.4 eV. Such a peak does not appear in the spectrum measured on samples without irradiation. In addition, the respective spectra measured on samples with 1-minute irradiation and with 10-minute irradiation are substantially identical in the shape of the peak. This means that changes in the UPS spectral shape within the binding energy range from 4.5 eV to 5.4 eV substantially converge with the irradiation for the duration of one minute or longer. This behavior is similar to that observed in C1s spectra. In addition, this behavior is assumed to indicate, similarly to C1s spectra, that the adherent removal effect is obtained by UV irradiation and that the effect becomes saturated with the irradiation performed for the duration of one minute or longer.

Figure 9:
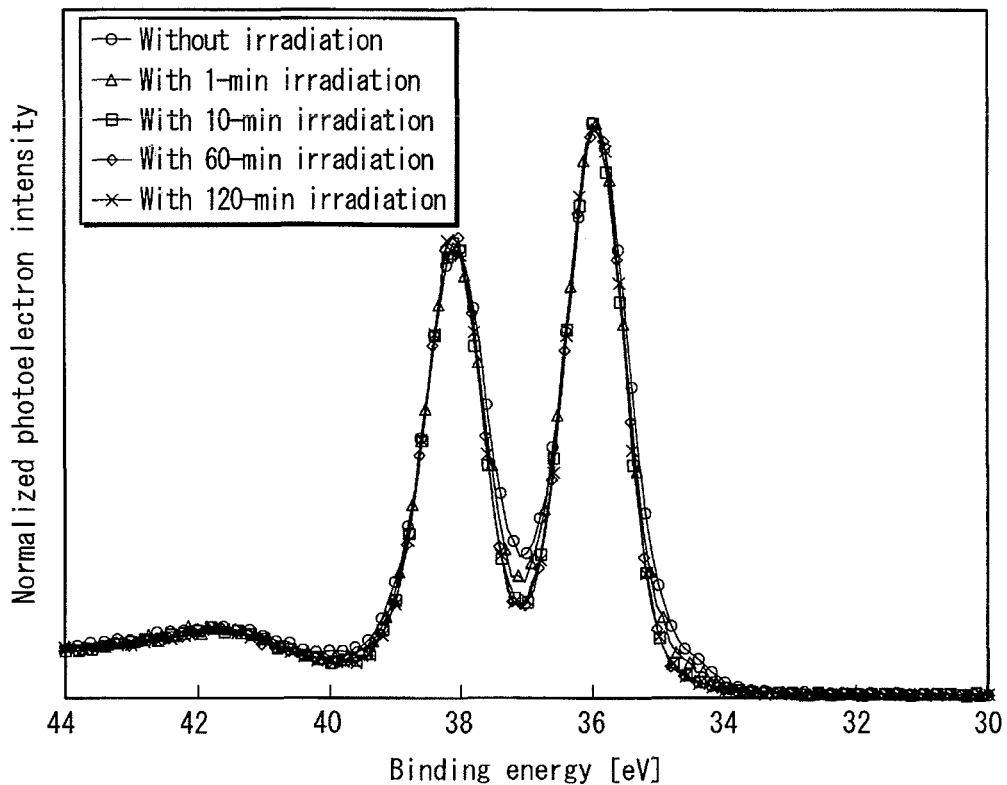
FIG. 9 is a view illustrating XPS spectra of tungsten oxide.

The second one of such a method uses XPS measurements to make a saturation determination based on changes in the W4f spectral shape. FIG. 9 shows W4f spectra measured on the respective samples without irradiation, with 1-minute irradiation, with 10-minute irradiation, with 60-minute irradiation, and with 120-minute irradiation. The spectra are normalized using the maximum and minimum values.

As shown in FIG. 9, all the samples with irradiation exhibit a peak steeper than a peak exhibited by the samples without irradiation (i.e., the half-width of each peak is smaller). It is noted, in addition, that the peak shape is slightly steeper for the samples with 10-minute irradiation than for the samples with 1-minute irradiation. Yet, for the samples with 10-minute irradiation, with 60-minute irradiation, and with 120-minute irradiation, the spectra coincide substantially entirely. This means that changes in the spectral shape converge for any samples with irradiation performed for the duration of ten minutes or longer.

Such changes in shape of W4f spectra resulting from different irradiation durations are explained in the following way, for example. Although it depends on the configuration of adherents, provided that the adherents supply negative charges to tungsten atoms present on the layer surface, the binding energy of the inner-shell orbital W4f becomes lower according to the negative charges. Chemically speaking, some of hexavalent tungsten atoms present on the layer surface of tungsten oxide change into lower-valent atoms, such as pentavalent atoms. In the XPS spectrum for W4f, this energy level shift is observed as a broader spectral shape because of the spectrum for hexavalent tungsten atoms, which make up the majority, overlaps with the spectrum for lower-valent tungsten atoms, which make up a small proportion.

In view of the above, with respect to the spectra illustrated in FIG. 9, it is assumed that the peak is sharper in shape because the removal of adherents by the UV irradiation alters pentavalent tungsten atoms back into hexavalent atoms. Form the above observation, it is understood that most of the adherents are removed by the UV irradiation performed for one minute and that the adherent removal effect has reached a level of saturation with the UV irradiation performed for ten minutes or longer. This behavior is similar to that observed on C1s.

In addition, although not illustrated in the figure, it is confirmed that the changes in the shape of the spectra for O1s orbital of oxygen atoms converge with the UV irradiation performed for ten minutes or longer.

From the above, the adherent removal effect achieved by the UV irradiation according to the present embodiment becomes saturated with the UV irradiation performed for a certain duration or longer. In the case where the metal oxide is tungsten oxide, the irradiation conditions are determined as follows. For example, the irradiation duration is determined by measuring, with respect to any specific irradiation intensity, the time taken for changes in the shape of the narrow-scan spectrum for W4 for O1s in XPS measurement converge or changes in the shape of UPS spectral region corresponding to the binding energy range from 4.5 eV to 5.4 eV converge. The time thus measured is determined to be the irradiation duration. More specifically, a spectrum measured after the UV irradiation for n-minute is compared with a spectrum measured after the UV irradiation for (n+1)-minute to obtain the difference between the two spectra at each of a plurality of measurement points. If the root-mean-square of the differences in the normalized intensity becomes equal to a specific value or smaller, it is then determined that the changes in the spectral shape converge with the irradiation duration of n-minutes and thus the maximum level of adherent removal has been completed. In this embodiment, it is determined from FIGS. 8 and 9 that the adherent removal effect becomes saturated with the UV irradiation performed for ten minutes.

(Regarding Maintaining Electronic State after UV Irradiation)

According to the present embodiment, the energy level resulting from structures similar to oxygen vacancies, which favorably affect the hole-injection ability, is maintained throughout the time from the surface cleaning and at least until another layer is formed on the cleaned surface. The grounds are as follows.

The UPS spectra shown in FIG. 5 described above were measured two days after the UV irradiation. That is, between the samples without irradiation and the samples with the respective irradiation durations that were left to stand in the atmosphere for two days after the UV irradiation, there is no notable difference in the spectral protrusion near the Fermi surface of the UPS spectra. In each UPS spectrum, the spectral protrusion is clearly observed. In addition, although not illustrated in the figures, measurements were made on samples two hours after the UV irradiation and one day after the UV irradiation. In these measurements, the spectral protrusion near the Fermi surface was clearly observed in each spectrum in a manner similar to FIG. 5. That is to say, it is confirmed that the energy level resulting from structures similar to oxygen vacancies are sustained in the atmosphere at least for two days after the UV irradiation.

This time period of two days is sufficiently long as compared with the time normally lapsed until the step of laminating the buffer layer 4 on the hole injection layer 3 is completed after the step of cleaning the hole injection layer 3 by UV irradiation. That is, unless the step of forming the buffer layer 4 is intentionally delayed, it is unlikely that the buffer layer 4 is not formed until after this two-day period.

(Regarding Improvements on EL Element Characteristics by UV Irradiation)

The organic EL element 1 according to the present embodiment manufactured using the step of cleaning the hole injection layer 3 by UV irradiation exhibits better characteristics as compared with an organic EL element manufactured without UV irradiation. Such characteristics are confirmed by the following experiments.

Firstly, the inventors prepared hole-only devices as assessment devices to be used in accurately determining the effect on the hole injection efficiency achieved by removing adherents from the surface of the hole injection layer 3 by UV irradiation.

Generally, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 10:
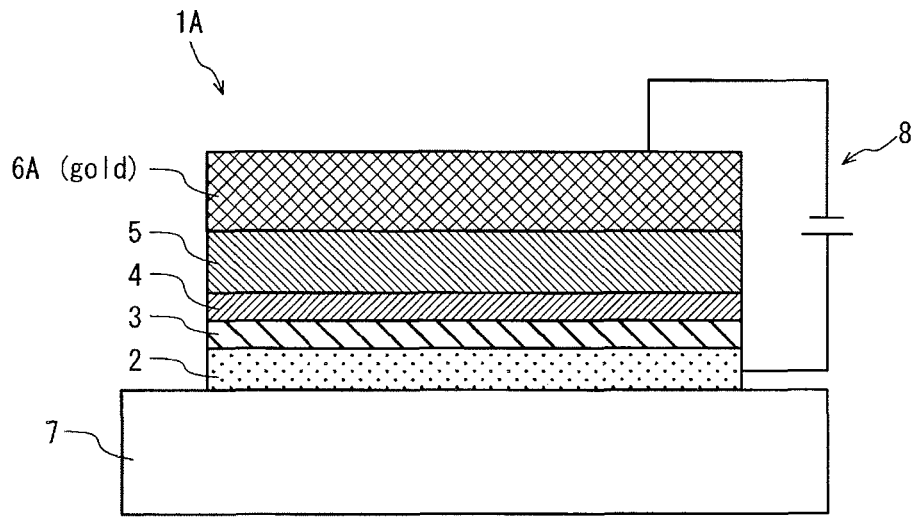
FIG. 10 is a schematic cross-sectional view illustrating a structure of a hole-only device.

In detail, the hole-only devices 1A prepared were actually obtained by replacing the cathode 6 of the organic EL element 1 illustrated in FIG. 1 with gold (Au) to form a cathode 6A as illustrated in FIG. 10. Specifically, by following the manufacturing method of the organic EL element 1 according to the present embodiment, a 50 nm-thick ITO thin film is formed as the anode 2 on the substrate 7 by a sputtering method, as illustrated in FIG. 10. Then, a 30 nm-thick tungsten oxide layer is formed as the hole injection layer 3 on the anode 2, by a predetermined sputtering method in a manner that the layer surface has the energy level resulting from structures similar to oxygen vacancies. Then, a 20 nm-thick layer of TFB, which is an amine-containing organic polymer, is formed as the buffer layer 4 on the hole injection layer 3, and a 70 nm-thick layer of F8BT, which is an organic polymer, is formed as the light-emitting layer 5. Finally, a 100 nm-thick layer of gold is formed as the cathode 6A on the light-emitting layer 5.

Note that two hole-only devices 1A were prepared. One of the hole-only devices 1A had the hole injection layer 3 exposed to the UV light according to the present embodiment (for the irradiation duration of 10 minutes) after the hole injection layer 3 is formed and taken out of the chamber of the sputtering film-forming apparatus. The other of the hole-only devices 1A had the hole injection layer 3 not exposed to UV light. Hereinafter, the former hole-only device 1A is referred to as "HOD with irradiation", whereas the latter hole-only device 1A is referred to as "HOD without irradiation".

Each of the hole-only devices 1A thus prepared was then connected to the DC voltage source 8, so that voltage was applied thereto. Further, the voltage applied to each sample was changed to measure the values of electric current flowing at different voltages. Each current value is then converted into a value per unit area (current density). Note that hereinafter, the "driving voltage" refers to a voltage applied to obtain the current density value is 0.4 mA/cm$^2$.

The hole injection efficiency of the hole injection layer 3 is said to be higher as the driving voltage is smaller, for the following reason. That is, the members composing the hole-only devices 1A, other than the hole injection layer 3, were prepared according to the same manufacturing method. Thus, it could be assumed that the hole injection barrier between two adjacent layers, other than that between the hole injection layer 3 and the buffer layer 4 is uniform in each of the hole-only devices 1A. Considering the above, it could be expected that the differences in driving voltage of the hole-only devices 1A resulting from whether or not the surface of the hole injection layer 3 was exposed to UV light closely reflects the hole injection efficiency from the hole injection layer 3 to the buffer layer 4.

Table 2 illustrates each of the hole-only devices 1A and a driving voltage thereof.

TABLE 2

| Sample Name | Drive Voltage |
| --- | --- |
| HOD with Irradiation | 18.9 V |
| HOD without Irradiation | 19.7 V |

Figure 11:
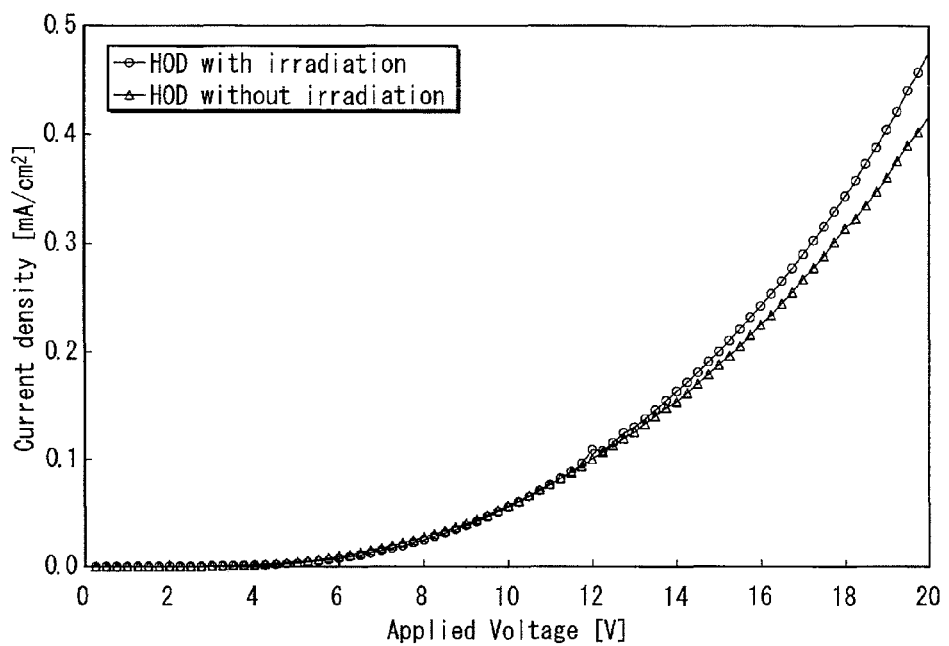
FIG. 11 is a device characteristics diagram of relation curves each illustrating a relation between applied voltage and electric current density of a different hole-only device.

In addition, FIG. 11 illustrates an electric current density-applied voltage curve of each of the hole-only devices 1A. In the figure, the vertical axis indicates electric current density (mA/cm$^2$), whereas the horizontal axis indicates applied voltage (V).

As shown in Table 2 and FIG. 11, when comparing the HOD with irradiation to the HOD without irradiation, the drive voltage is lower and the rising of the electric current density-applied voltage curve is quicker. Further, it could be seen that HOD with irradiation requires for the lowest level of applied voltage to reach a high electric current density compared with HOD without irradiation. That is, HOD with irradiation has a higher degree of hole injection efficiency compared with HOD without irradiation.

In the above, observation has been made of the hole injection efficiency of the hole injection layer 3 in each of the hole-only devices 1A. However, it should be emphasized that the hole-only devices 1A and the organic EL element 1 illustrated in FIG. 1 have nearly the same structure, differing only in the cathode 6A. That is, the organic EL element 1 is essentially the same as hole-only devices 1A in terms of the effect imposed by the adherent removal by the UV irradiation on the efficiency of hole injection form the hole injection layer 3 to the buffer layer 4.

In order as to confirm the above, two samples of organic EL element 1 were prepared. One of the samples were prepared using the hole injection layer 3 exposed to UV light, and the other of the samples were prepared using the hole injection layer 3 not exposed to UV light. Hereinafter, the former sample of the organic EL element 1 is referred to as "BPD with irradiation", whereas the latter is referred to as "BPD without irradiation". Except that the hole injection layer 3 of the BPD without irradiation was not exposed to UV light, the BPDs were manufactured by the manufacturing method according to the present embodiment.

Each sample organic EL apparatus 1 thus prepared was connected to the DC power source 8, so that voltage was applied thereto. Further, the voltage applied to each sample was changed to measure the values of electric current flowing at different voltages. Each current value is then converted into a value per unit area (current density). Note that hereinafter, the "driving voltage" refers to a voltage applied to obtain the current density value is 10 mA/cm$^2$.

Table 3 illustrates each of the sample organic EL elements 1 and a driving voltage thereof.

TABLE 3

| Sample Name | Drive Voltage |
| --- | --- |
| BPD with Irradiation | 8.3 V |
| BPD without Irradiation | 9.2 V |

Figure 12:
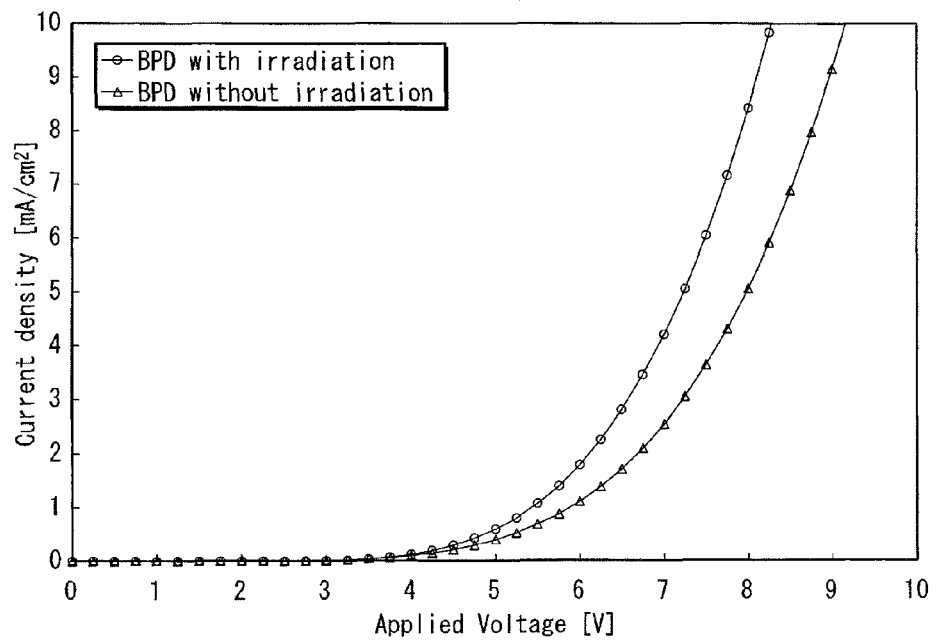
FIG. 12 is a device characteristics diagram of relation curves each illustrating a relation between applied voltage and electric current density of a different organic EL element.

In addition, FIG. 12 illustrates an electric current density-applied voltage curve of each of the sample organic EL elements 1A. In the figure, the vertical axis indicates electric current density (mA/cm$^2$), whereas the horizontal axis indicates applied voltage (V).

As shown in Table 3 and FIG. 12, when comparing the BPD with irradiation to the BPD without irradiation, the drive voltage is lower and the rising of the electric current density-applied voltage curve is quicker. Further, it could be seen that BPD with irradiation requires for the lowest level of applied voltage to reach a high electric current density compared with BPD without irradiation. This tendency is the same as that observed with the HOD with irradiation and HOD without irradiation.

By the above experiments, it is confirmed regarding the organic EL element 1 that the effect imposed on the hole injection efficiency from the hole injection layer 3 to the buffer layer 4 as a result of removal of adherents by UV irradiation to the surface of the hole injection layer 3 is similar to that confirmed with the hole-only devices 1A.

By the above experiments, the following is confirmed. That is, by UV irradiation performed in a predetermined manner according to the present embodiment after the hole injection layer 3 is formed, adherents are removed to the maximum extent from the surface of the hole injection layer 3 without affecting the energy level resulting from structures similar to oxygen vacancies. This means that adherents, which are likely to cause increase of the drive voltage and decrease of the life of the organic EL element 1, are removed without impairing the hole injection ability. Consequently, the efficiency in injecting holes from the hole injection layer 3 to the buffer layer 4 is improved, so that excellent characteristics of the organic EL element is realized.

(Regarding Wavelength of Ultraviolet Light)

According to the present embodiment, after the hole injection layer 3 is formed, adherents on the hole injection layer 3 is removed by radiating ultraviolet light of a predetermined wavelength in the atmosphere. An organic EL element 1 having the hole injection layer 3 having been subjected to the adherents removal operates on a lower drive voltage than an organic EL element manufactured without removal of adherents. The wavelength of ultraviolet light was determined through the following observations.

First, the wavelength of ultraviolet light that generates ozone ($O_3$) in a gas atmosphere containing oxygen molecules ($O_2$), such as in the atmosphere is 184.9 nm. By the following reaction, the oxygen molecules are decomposed by ultraviolet light at 184.9 nm to yield oxygen radicals, which are then combined with remaining oxygen molecule to generate ozone.

In addition, the wavelength of ultraviolet light causing further decomposition of ozone to yield oxygen radicals again is 253.7 nm.

In UV ozone cleaning, ultraviolet light at 184.9 nm and 253.7 nm is employed to generate oxygen radicals and their strong oxidation is used to remove adherents. Therefore, as confirmed by the experiments described above, there is a risk that the energy level resulting from structures similar to oxygen vacancies disappears almost completely from the layer surface by UV ozone cleaning.

In view of the above risk, the present embodiment uses ultraviolet light in a wavelength region of 184.9 nm or longer as such ultraviolet light is not likely to cause decomposition of oxygen molecules to yield oxygen radicals. It is also preferable to use ultraviolet light within a wavelength region of 253.7 nm or longer in order to avoid decomposition of atmospheric oxygen into ozone to yield oxygen radicals although the amount of such oxygen is small.

Figure 13:
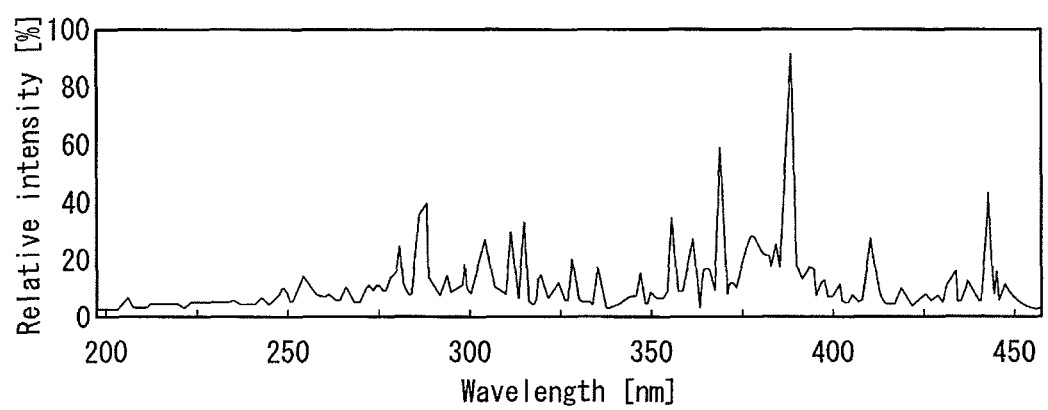
FIG. 13 is a view illustrating the spectral distribution of a metal halide lamp employed in an embodiment of the present invention.

The metal halide lamp actually used in the present embodiment has a spectral distribution illustrated in FIG. 13. As illustrated in the figure, the present embodiment uses a lamp that emits light of wavelengths of 253.7 nm or shorter as little as possible. In light emitted by the metal halide lamp, the intensity at 253.7 nm or shorter is at most a few percent of the maximum intensity (at about 380 nm).

Next, the binding energies between different combinations of atoms that may present in typical adherents are shown in Table 4. In the table, the mark "=" indicates double bond, whereas the mark "—" indicates single bond. To remove adherents, first, it is required to irradiate the layer surface with light having energy stronger than the bonding energies to break the bonds.

TABLE 4

| Binding | Binding Energy |
|---------|----------------|
| C=C | 607 |
| C—C | 348 |
| C=O | 724 |
| C—O | 352 |
| C—H | 413 |
| O=O | 490 |
| O—O | 139 |
| O—H | 463 |

Note that the light energy E per mol of photons and the wavelength λ are in the inverse proportion shown below.
E = Nhc/λ
(N: Avogadro's number, h: Planck's constant, c: velocity of light, and λ: wavelength)

From the above expression, the energy of ultraviolet light at the wavelength 184.9 nm is calculated to be 647 kJ/mol. Similarly, the energy of ultraviolet light at the wavelength 253.7 nm is calculated to be 472 kJ/mol. With reference to Table 4, the energy value of the ultraviolet light in the wavelength region determined according to the present embodiment is sufficient to disconnect most of atomic bonds typically appearing in adherents. Especially, as will be later described in detail, in the case of chemical adsorption, adherents mainly make single bonds to oxygen atoms present in tungsten oxide. The strongest singe bond with atoms present in adherents is O—H bond with the bonding energy of 463 kJ/mol (corresponding to wavelength of 258 nm) or so. Therefore, the ultraviolet light within the wavelength region of the present embodiment is strong enough to break the chemical bond. In the case of physical adsorption, the bonding is far weaker than chemical adsorption, so that such adherents are readily removed by UV irradiation.

The above describes the reason why the ultraviolet light used in the present embodiment is sufficient to remove adherents.

Indeed, the efficiency of adherent removal by the UV radiation according to the present embodiment is essentially lower than UV ozone cleaning. This is because the UV ozone cleaning ensures that adherents being unbonded are immediately oxidized with oxygen radicals to form molecules such as $CO_2$ and $H_2O$, which easily migrate. As has been already described, however, UV ozone cleaning is not suitable for cleaning the hole injection layer 3 composed of metal oxide, such as tungsten oxide.

To be noted next is that atomic bonds occurring in metal oxide is not generally broken by the energy of ultraviolet light within the wavelength region according to the present embodiment. According to Non-Patent Literature 3, for example, the binding energy between oxygen atom and tungsten atom in tungsten oxide is 672 kJ/mol (corresponding to the wavelength of 178 nm). That is, it is difficult to break the bond between oxygen atom and tungsten atom with ultraviolet light within the wavelength region according to the present embodiment. This is in contrast with the above-described sputter etching performed in vacuum by using argon ion. That is, with the use of ultraviolet light according to the present embodiment, adherents are removed without breaking atomic bonds present in the hole injection layer 3 composed of metal oxide, such as tungsten oxide. That is, adherents are removed without making the hole injection layer 3 chemically active, i.e., while the hole injection layer 3 is chemically stable.

For the reasons described above, the present invention uses ultraviolet light at the wavelength of 184.9 nm or longer, preferably 253.7 nm or longer. Note that visible light is generally incapable of breaking the bond of chemical adsorption.

The present embodiment therefore uses ultraviolet light (380 nm or shorter), rather than visible light.

(Reason for which Energy Level Affecting Hole Injection Ability is Maintained After UV Irradiation)

According to the present embodiment, the energy level resulting from structures similar to oxygen vacancies on the layer surface is continuously maintained even after UV irradiation and thus the hole injection ability is maintained with stability. That is, the present embodiment ensures manufacturing of organic EL elements which operate on low drive voltage. This property of maintaining the energy level is considered below.

It has been frequently reported, with reference to results of experiments and first principles calculations, that existence of the energy level which can be seen in a thin film of, or a crystal of tungsten oxide, derives from structures similar to oxygen vacancies. More specifically, it is assumed that the existence of the energy level on interest results from bonding orbitals formed, by the absence of oxygen atoms, from the 5d orbitals of adjacent tungsten atoms and also results from the 5d orbitals of singular tungsten atoms not terminated with an oxygen atom and exist on the layer surface or within the layer.

Here, it may be assumed that 5d orbitals of tungsten atoms are more stable when present in chemically adsorbed adherents, as compared with the case where the 5d orbitals are present as bonding orbitals or as the 5d orbitals of singular tungsten atoms. However, such an assumption is not necessarily correct. Actually, as observed in the UPS spectra illustrated in FIG. 5, tungsten oxide left to stand in the atmosphere for two day exhibits a spectral protrusion near the Fermi surface, which is the indication of the energy level being discussed.

Figure 14:
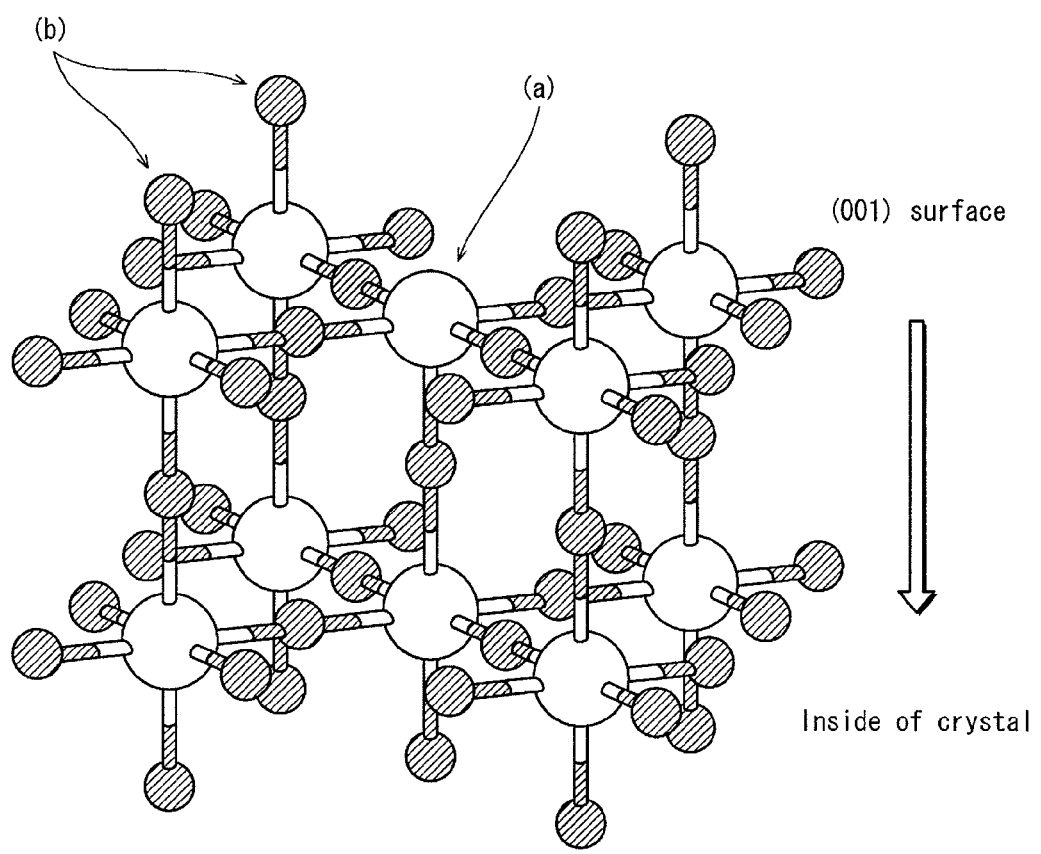
FIG. 14 is a view illustrating the surface configuration of tungsten oxide.

In Non-Patent Literature 4, it has been reported that when tungsten trioxide single crystal is cleaved in vacuum to expose the clean (001) surface, part of oxygen atoms present on the outermost surface are emitted. Non-Patent Literature 4 further reports the following reason, which has been confirmed by the first principles calculations, for which the (001) surface is more stable in terms of energy when a tungsten atom not terminated with an oxygen atom is periodically present on the outermost surface as shown in FIG. 14 than when all the tungsten atoms are terminated with an oxygen atom. That is, when all the tungsten atoms present on the outermost surface are terminated with an oxygen atom, the electrical repulsive force occurring between terminal oxygen atoms becomes large, which causes the instability. In short, the (001) surface is more stable when structures similar to oxygen vacancies (a) are present on the surface.

FIG. 14 illustrates tungsten oxide atoms each surrounded by six oxygen atoms to form an octahedron with the six oxygen atoms at the vertices. For the simplicity sake, in the figure, the octahedrons are arranged in orderly succession in a manner similar to the rhenium oxide structure. In practice, however, the octahedrons are distorted to some extent and arranged without such orderliness.

By analogy with the above findings, the following mechanism may be one example of the reason for which the energy level resulting from structures similar to oxygen vacancies is maintained on the surface of the hole injection layer 3 continuously after the UV irradiation according to the present embodiment.

According to the present invention, the hole injection layer 3 composed of tungsten oxide is assumed to have a (001) facet at least locally on the layer surface immediately after the formation of the hole injection layer 3. That is, as illustrated in FIG. 14, the hole injection layer 3 is assumed to have terminal oxygen atoms (b) and tungsten atoms not terminated with an oxygen atom (a). Non-terminated tungsten atoms (a) are surrounded by terminal oxygen atoms (b). It is because the (001) surface has a stable structure. It is this surface that is exposed to impurity molecules and atomic molecules in the chamber of the sputtering film-forming apparatus subsequently to the formation of the hole injection layer 3.

In general, if unsaturated metal atoms such as (a) are present on the layer surface of metal oxide, the metal atoms tend to be terminated with a water or organic molecule as a result of chemical adsorption. In the present embodiment, however, none of the W4f spectra illustrated in FIG. 9 have a peak in a binding energy range from 31 eV to 33 eV at which a peak derived from the bonding between a tungsten atom and a carbon atom should appear. Instead, each W4f spectra illustrated in FIG. 9 has a peak derived from the bonding between a tungsten atom and an oxygen atom. It is therefore highly likely that the atoms of adsorbed molecules to which tungsten atoms (a) are chemically bonded is oxygen atoms.

However, for example, a tungsten atom (a) may chemically react with a water molecule to form a hydroxyl group or a tungsten atom (a) may chemically react with an organic molecule to be bonded to an oxygen atom contained in the organic molecule. In such cases, a repulsive force is generated between an adsorbed oxygen atom, which generally is in negatively charged, and adjacent terminal oxygen atoms (a), which are also negatively charged. In view of the above, it is expected that adsorption of molecules to tungsten atoms (a) is relatively unlikely, for the same reason for which tungsten atoms (a) are unlikely to have terminal oxygen atoms in vacuum.

On the other hand, terminal oxygen atoms (b) surrounding tungsten atoms (a) undergo addition reaction with water molecules and organic molecules to cause chemical adsorption. Such chemical adsorption occurs relatively easily as there is substantially no factor inhibiting adsorption, such as repulsive force. In some cases, the chemical adsorption to terminal oxygen atoms (b) may result in that organic molecules composed of a few or more atoms are present in the immediate vicinity of tungsten atoms (a). Such organic molecules act as spatial barriers to against adsorbing molecules. Therefore, adsorption of molecules to terminal oxygen atoms (b) is also expected to prevent adsorption of molecules to tungsten atoms (a).

From the above consideration, in the layer surface having: terminal oxygen atoms (b); and tungsten atoms (a) not terminated with an oxygen atom and surrounded by the terminal oxygen atoms (b) as illustrated in FIG. 14, the occurrence of chemical adsorption to the tungsten atoms (a) is less likely. Instead, impurity molecules and atomic molecules tend to chemically adhere to the terminal oxygen atoms (b) surrounding tungsten atoms (a). Note that the chemical adsorption occurring in this case is a bond via a terminal oxygen atom and thus generally is a single bond.

In response to the UV irradiation according to the present embodiment, only molecules chemically bonded to oxygen atoms (b) are disconnected and released. As a result, it is expected that the oxygen atoms (b) revert to terminal oxygen atoms as they were before the chemical adsorption or react with water molecules to form hydroxyl groups, which are stable and not easily disconnected by the UV irradiation according to the present embodiment.

To summarize the above, the hole injection layer 3 composed of tungsten oxide according to the present embodiment has, on the layer surface, the local structure as illustrated in FIG. 14. That is, tungsten atoms (a) not terminated with an oxygen atom are surrounded by terminal oxygen atoms (b). First of all, this structure per se has a characteristic which prevents adsorption of molecules. In addition, molecules adhered to terminal oxygen atoms (b) are released by UV irradiation, after which hydroxyl groups mainly remain present on the layer surface. In this manner, while adherents are removed by UV radiation performed after the layer formation, the electronic state resulting from structures similar to oxygen vacancies (a) on the layer surface is maintained without being affected by the UV irradiation. The electron state thus maintained positively affects the hole injection ability.

<UV Irradiation Apparatus>

Next, the following describes an UV irradiation apparatus employed in an embodiment of the present invention. FIG. 4B illustrates an UV irradiation apparatus 20 according to one aspect of the present invention. The UV irradiation apparatus 20 is for irradiating ultraviolet light to an intermediate product 9 of the organic EL element 1 and includes: a light source 21 that emits ultraviolet light mainly within the wavelength region longer than 184.9 nm and equal to 380 nm or shorter; a reflector 22 that reflects ultraviolet light emitted by the light source 21 toward the intermediate product 9; a housing 23 that houses the light source 21 and reflector 22 to hold them in place; and a control unit 24 that controls ON/OFF of the light source 21.

The intermediate product 9 has, for example, the anode 2 and the hole injection layer 3 composed of metal oxide layered on the substrate 7 but the buffer layer 4 has not been formed yet.

The light source 21 is, for example, a straight metal halide lamp disposed to longitudinally coincide with the widthwise direction of the intermediate product 9 being transferred. The light source 21 is operated to emit light under the conditions suitable for effective manufacturing of organic EL elements capable of emitting light at high intensity and low electrical consumption. The conditions of UV irradiation, such as irradiation duration and irradiation intensity, are determined based on various factors, including the formation conditions of the hole injection layer 3, such as the type of metal oxide used, and the convergence of changes in shape of photoelectron spectroscopy spectra exhibited by the samples of the hole injection layer 3 as described in the present embodiment. The irradiation conditions are set by the operator. Alternatively, the irradiation conditions may be automatically set by the control unit 24. For example, the control unit 24 stores a database in which layer forming conditions, irradiation durations, and irradiation intensities are correlated. On receiving input of the layer forming conditions by the operator, the control unit 24 sets the irradiation duration and intensity with reference to the database.

The intermediate product 9 is transported to the position for UV irradiation by a conveyer 25. In the figure, the intermediate product 9 placed onto the conveyer 25 from the upstream (right-hand side of the figure) in the transport direction is transported by the conveyer 25 to pass the position for receiving UV irradiation. While passing the position, a predetermined amount of ultraviolet light is applied to the upper surface of the intermediate product 9, i.e., the upper surface of the hole injection layer 3. Having been irradiated with ultraviolet light, the intermediate product 9 is transported out to the downstream (left-hand side of the figure).

In the UV irradiation apparatus 20 described above, the light source 21 is not limited to a metal halide lamp. Alternately, the light source 21 may be any light source capable of emitting ultraviolet light mainly within the wavelength region longer than 184.9 nm and equal to 380 nm or shorter (preferably, longer than 253.7 nm and equal to 380 nm or shorter).

<Modifications>

Up to this point, a manufacturing method of an organic EL element according to one aspect of the present invention has been specifically described. In addition, an UV irradiation apparatus according to one aspect of the present invention has been specifically described. However, the specific embodiment(s) described above is an example used in order to clearly illustrate a structure of the present invention and the effects and advantages thereof. The present invention is not limited to the specific embodiment described above. For example, the sizes and/or materials specifically mentioned are merely typical examples used to make it easier to understand the present invention. The present invention is not limited to such a specific size and/or material.

For example, the metal oxide contained in the hole injection layer 3 is not limited to tungsten oxide. Alternatively, the hole injection layer 3 may contain any one of, or a combination of any two or more of the following metal oxides, namely, molybdenum oxide, chromium oxide, vanadium oxide, niobium oxide, tantalum oxide, titanium oxide, zirconium oxide, hafnium oxide, scandium oxide, yttrium oxide, thorium oxide, manganese oxide, iron oxide, ruthenium oxide, osmium oxide, cobalt oxide, nickel oxide, copper oxide, zinc oxide, cadmium oxide, aluminum oxide, gallium oxide, indium zinc oxide, silicon oxide, germanium oxide, stannous oxide, lead oxide, antimony oxide, bismuth oxide, and an oxide of any of so-called rare-earth elements ranging from lanthanum to lutetium.

As an example of the hole injection layer composed of a metal oxide other than tungsten oxide, the hole injection layer composed of molybdenum oxide is described below. It is clarified by the following experiments that adherents on the surface of the hole injection layer 3 decrease as a result of the cleaning by UV irradiation according to the present embodiment even if the hole injection layer 3 is composed of molybdenum oxide.

In the experiments, samples without irradiation, samples with 10-minute irradiation, and samples with 60-minute irradiation were prepared in a manner similarly to the experiments on tungsten oxide.

Figure 15:
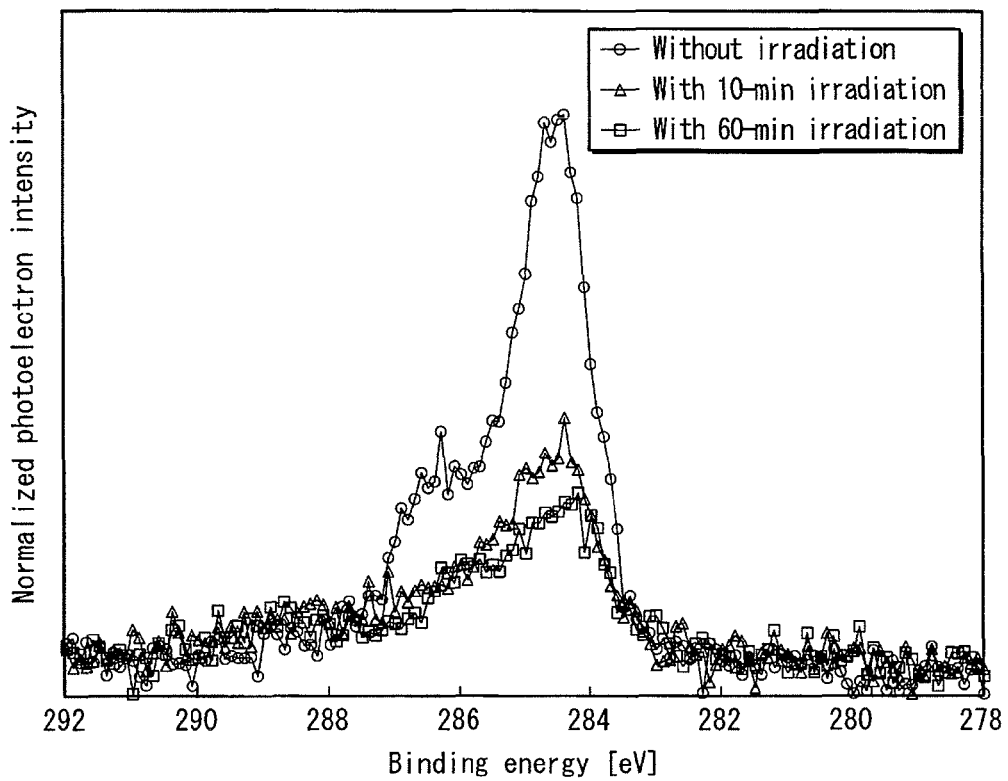
FIG. 15 is a view illustrating XPS spectra of molybdenum oxide.

First, each sample was subjected to XPS measurements to obtain narrow-scan spectra for the Mo 3f orbital (Mo3d) and also for the C1s orbital (C1s). After appropriately subtracting background components from the respective spectra, the photoelectron intensity of the narrow-scan spectra for Mo3d was normalized using the area intensity. The narrow-scan spectra for C1s of the respective samples are shown in FIG. 15. The area intensity of each C1s spectrum shown in FIG. 15 is proportional to the ratio of the number density of carbon atoms to the number density of molybdenum atoms present in the surface region of the hole injection layer 3 composed of molybdenum oxide. The surface region is up to several nanometers in depth from the layer surface.

As shown in FIG. 15, each of samples with 10-minute irradiation and with 60-minute irradiation exhibited C1s spectra with a weaker area intensity as compared with the sample without irradiation. From this observation, it is assumed that carbon atoms decrease by UV irradiation. In other words, adherents were removed by the UV irradiation.

Next, evaluations were made on the respective UPS spectra to see changes in the shape of UPS spectral regions each corresponding to the binding energy range around the top of the valence band (i.e., the UPS spectral regions each corresponding to the binding energy range from 3.7 eV to 5.2 eV). A peak or shoulder appearing in this spectral region indicates a lone pair of electrons in the 2p orbital in oxygen atoms constituting molybdenum oxide.

Figure 16:
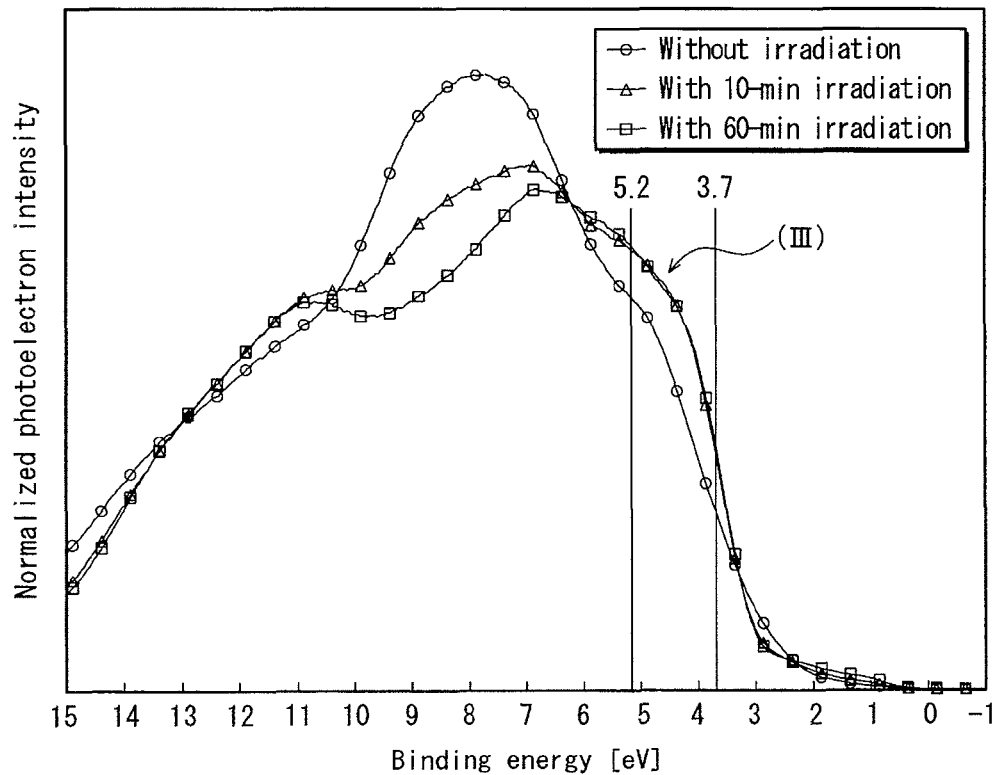
FIG. 16 is a view illustrating UPS spectra of molybdenum oxide.

The UPS measurements were made on the respective samples without irradiation, with 10-minute irradiation, and with 60-minute irradiation. FIG. 16 illustrates the UPS spectra. The photoelectron intensity is normalized using the intensity at the binding energy 6.2 eV.

As shown in FIG. 16, the spectrum of each of the samples with 10-minute irradiation and with 60-minute irradiation exhibited a broad shoulder appearing in the region corresponding to the binding energy range from 3.7 eV to 5.2 eV (this region is denoted by "(III)" in the figure), as compared with the sample without irradiation. In addition, the shoulders of the spectra closely match in shape between the samples with 10-minute irradiation and with 60-minute irradiation. This means that the changes in shape of UPS spectral portion within the range of binding energy from 3.7 eV to 5.2 eV substantially converge with respect to the samples with irradiation duration of ten minute or longer. This is assumed to indicate that the adherent removal effect becomes saturated.

Figure 17:
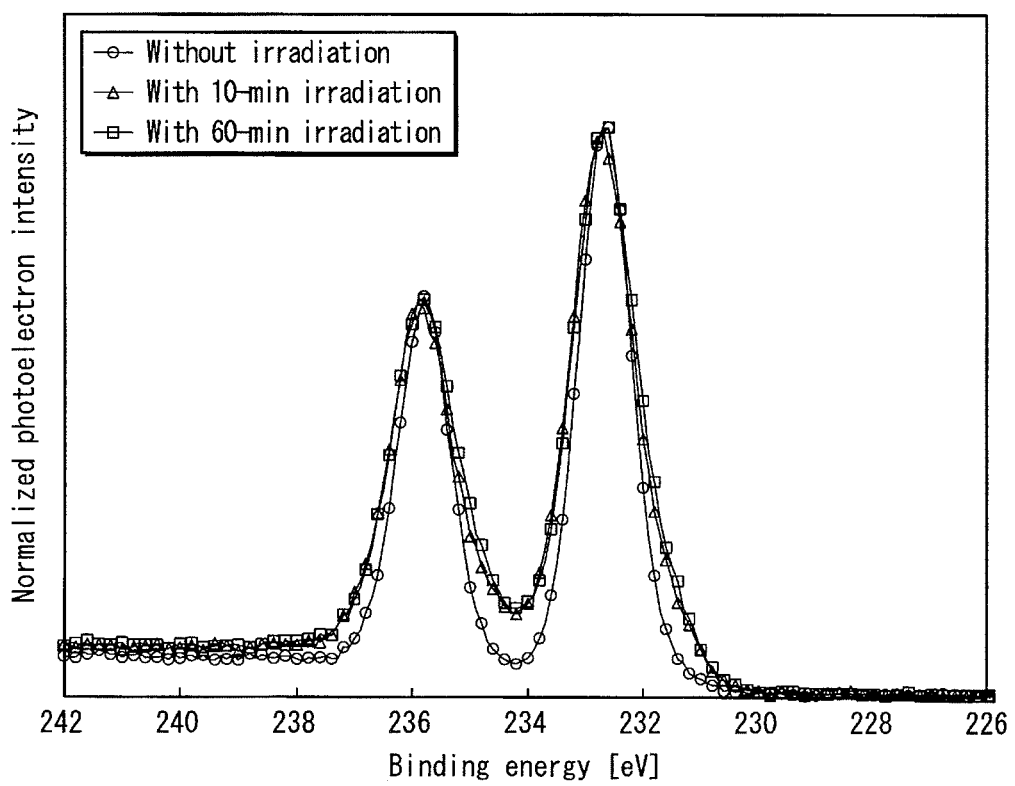
FIG. 17 is a view illustrating XPS spectra of molybdenum oxide.

Next, evaluations were made on changes caused by the UV irradiation in the shape of Mo3d spectra obtained by XPS measurement. FIG. 17 shows the Mo3d spectra of the respective samples without irradiation, with 10-minute irradiation, and with 60-minute irradiation. The spectra are normalized using the maximum and minimum values.

As shown in FIG. 17, all the samples with irradiation exhibited a peak broader than a peak exhibited by the samples without irradiation (i.e., the half-width of the peaks is wider). In addition, the extent to which the half-width of the peak becomes wider is smaller as the irradiation duration is longer. This indicates that changes in spectral shape tend to converge as the irradiation duration is longer.

From the above, the following is also known. That is, even in the case where the metal oxide constituting the hole injection layer 3 is molybdenum oxide, the adherent removal effect achieved by the UV irradiation according to the present embodiment becomes saturated at a certain irradiation duration or longer. In the case where the metal oxide is molybdenum oxide, the irradiation conditions are determined as follows. For example, the irradiation duration is determined by measuring, with respect to any specific irradiation intensity, the time taken for changes in the shape of the narrow-scan spectrum for Mo3d or O1s in XPS measurement converge or changes in the shape of UPS spectral region corresponding to the binding energy range from 3.7 eV to 5.2 eV converge. The time thus measured is determined to be the irradiation duration. More specifically, a spectrum measured after irradiation for n-minute is compared with a spectrum measured after irradiation for (n+1) minutes to obtain the difference between the two spectra at each of a plurality of measurement points. If the root-mean-square of differences in the normalized intensity becomes equal to a specific value or smaller, it is then determined that the change in the shape of spectra converge as a result of the irradiation for the n-minute duration and thus adherent removal at the maximum level has been completed. In this embodiment, it is determined from FIG. 16 that the adherent removal effect becomes saturated as a result of the UV irradiation for ten minutes.

(Additional Matters)

In the manufacturing method for organic EL elements according to one aspect of the present invention, the UV irradiation is performed in the ambient atmosphere. Alternatively, however, the UV irradiation may be performed in various other gas atmospheres, such as reduced-pressure atmosphere, inert gas atmosphere, or vacuum. The above variations are possible because the cleaning by UV irradiation uses ultraviolet light at such wavelengths not generating oxygen radicals. Still, however, the UV irradiation performed in the atmosphere is advantages in the manufacture of large-sized panels, for the reasons stated above.

Further, the implementation of the organic EL element of the present invention is not limited to a structure where the organic EL element is used alone. A plurality of organic EL elements of the present invention may be integrated on a substrate as pixels to form an organic EL panel. An organic EL display so yielded may be implemented by appropriately arranging the thickness of each of the layers in each of the organic EL elements.

In the manufacture of organic EL panels using application-type organic EL elements, the step of integrating a plurality of organic EL elements as pixels on a substrate is performed in the following manner, for example. That is, banks defining the pixels are formed on the hole injection layer composed of metal oxide and functional layers are overlaid within the regions defined by the banks. The step of forming the banks is performed in the following manner, for example. First, a bank material composed of photosensitive resist material is applied onto the surface of the hole injection layer, followed by pre-baking of the bank material. Then, the bank material is exposed to light via a pattern mask to remove unhardened, redundant bank material with a developer, followed by rinsing with pure water. The present invention is applicable to the hole injection layer composed of metal oxide having undergone the bank forming step as above. In this case, by performing the UV irradiation of the surface of the hole injection layer after the banks are formed, organic molecules, which are residues of banks and developer, are removed from the surface of the hole injection layer. In general, irradiating banks with ultraviolet light results in changes in the contact angle of each bank with respect to an organic solvent applied as an upper layer. Yet, according to the present invention, it is easy to uniformly determine the irradiation conditions of ultraviolet light. Therefore, the contact angle and the bank configuration can be appropriately adjusted in view of the uniformly determined irradiation conditions.

The organic EL element according to one aspect of the present invention may be a so-called bottom emission type or a top emission type.

[Industrial Applicability]

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from low luminous intensity to high luminous intensity for the use as a light source or the like, and which can be driven at a low voltage. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources; and etc.

The invention claimed is:

1. An organic electroluminescent (EL) element, comprising:
   an anode;
   a cathode;
   a hole injection layer; and
   a functional layer disposed between the anode and the cathode, the functional layer containing an organic material, holes being injected to the functional layer from the hole injection layer, the hole injection layer containing tungsten oxide and has adherents on a surface thereof, the adherents containing atoms other than tungsten and oxygen atoms, the hole injection layer is irradiated with ultraviolet light such that an Ultraviolet Photoelectron Spectroscopy (UPS) spectrum of the hole injection layer, obtained from a UPS measurement, has a protrusion appearing near a Fermi surface and within a region corresponding to a binding energy range lower than a top of a valence band, the tungsten oxide contained in the hole injection layer satisfying a condition, determined from an X-ray Photoelectron Spectroscopy (XPS) measurement, that a ratio in a number density of the other atoms to the tungsten atoms does not exceed approximately 0.83, the tungsten oxide is represented by a composition WOx, where x is a real number within the range of 2<x<3, the UPS measurement has a light source He I, the XPS measurement has a light source Al K α, and the XPS and UPS measurements have an electron emission angle which is a normal line direction to a substrate surface of the organic EL.

2. The organic EL element according to claim 1, wherein in the UPS spectrum, the protrusion appears within the region corresponding to the binding energy range from approximately 1.8 eV to approximately 3.6 eV lower than the top of the valance band.

3. The organic EL element according to claim 1, wherein the ratio in the number density of the other atoms to the tungsten atoms does not exceed approximately 0.62.

4. The organic EL element according to claim 1, wherein the atoms other than tungsten atoms and oxygen atoms comprise carbon atoms.

5. An organic EL element, comprising:
an anode;
a cathode;
a hole injection layer; and
a functional layer disposed between the anode and the cathode, the functional layer containing an organic material, holes being injected to the functional layer from the hole injection layer, the hole injection layer containing tungsten oxide and has adherents on a surface thereof, the adherents containing atoms other than tungsten atoms and oxygen atoms, the hole injection layer is irradiated with ultraviolet light such that an Ultraviolet Photoelectron Spectroscopy (UPS) spectrum of the hole injection layer, obtained from an UPS measurement, having:
a protrusion appearing near a Fermi surface and within a region corresponding to a binding energy range lower than a top of a valence band, and
a peak appearing within a region corresponding to a binding energy range from approximately 4.5 eV to approximately 5.4 eV, the tungsten oxide is represented by a composition WOx, where x is a real number within the range of 2<x<3, and the UPS measurement has a light source He I and an electron emission angle which is a normal line direction to a substrate surface of the organic EL.

6. The organic EL element according to claim 5, wherein in the UPS spectrum, the protrusion appears within the region corresponding to the binding energy range from approximately 1.8 eV to approximately 3.6 eV lower than the top of the valance band.

7. An organic EL element, comprising:
an anode;
a cathode;
a hole injection layer; and
a functional layer disposed between the anode and the cathode, the functional layer containing an organic material, holes being injected to the functional layer from the hole injection layer, the hole injection layer containing molybdenum oxide and has adherents on a surface thereof, the adherents containing atoms other than molybdenum atoms and oxygen atoms, the hole injection layer is irradiated with ultraviolet light such that an Ultraviolet Photoelectron Spectroscopy (UPS) spectrum of the hole injection layer, obtained from a UPS measurement, having:
a protrusion appearing near a Fermi surface and within a region corresponding to a binding energy range lower than a top of a valence band, and
a peak appearing within a region corresponding to a binding energy range from approximately 3.7 eV to approximately 5.2 eV, the molybdenum oxide is represented by a composition MoOx, where x is a real number within the range of 2<x<3, and the UPS measurement has a light source He I and an electron emission angle which is a normal line direction to a substrate surface of the organic EL.

8. The organic EL element according to claim 7, wherein in the UPS spectrum, the protrusion appears within the bonding energy range that is from approximately 1.2 eV to approximately 3.0 eV lower than the top of the valance band.

9. A display apparatus comprising an organic EL element according to claim 1.

10. A light-emitting apparatus comprising an organic EL element according to claim 1.

11. A display apparatus comprising an organic EL element according to claim 5.

12. A light-emitting apparatus comprising an organic EL element according to claim 5.

13. A display apparatus comprising an organic EL element according to claim 7.

14. A light-emitting apparatus comprising an organic EL element according to claim 7.

* * * * *